(12) United States Patent
Tong et al.

(10) Patent No.: US 11,171,673 B2
(45) Date of Patent: Nov. 9, 2021

(54) DECODING METHOD AND APPARATUS

(71) Applicant: Huawei Technologies Co., Ltd., Shenzhen (CN)

(72) Inventors: Jiajie Tong, Hangzhou (CN); Huazi Zhang, Hangzhou (CN); Yunfei Qiao, Hangzhou (CN); Rong Li, Hangzhou (CN); Xiaocheng Liu, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/923,898

(22) Filed: Jul. 8, 2020

(65) Prior Publication Data
US 2020/0343916 A1 Oct. 29, 2020

Related U.S. Application Data

(63) Continuation of application No. PCT/CN2018/124375, filed on Dec. 27, 2018.

(30) Foreign Application Priority Data

Jan. 9, 2018 (CN) .......................... 201810020396.4

(51) Int. Cl.
*H03M 13/45* (2006.01)
*H03M 13/09* (2006.01)

(52) U.S. Cl.
CPC .......... *H03M 13/45* (2013.01); *H03M 13/09* (2013.01)

(58) Field of Classification Search
CPC ...................................................... H03M 13/45
(Continued)

(56) References Cited

U.S. PATENT DOCUMENTS 7,441,110 B1 * 10/2008 Puzak .................. G06F 8/4442
712/207
2002/0188906 A1 12/2002 Kurtas et al.
(Continued)

FOREIGN PATENT DOCUMENTS

CN 104038234 A 9/2014
CN 104158549 A 11/2014
(Continued)

OTHER PUBLICATIONS

He et al., "A CRC-SCL based Decoding Algorithm of Polar Codes," Study on Optical Communications, with English Abstract, Sum. No. 200, pp. 19-22 & 36, School of Communication Engineering, 017.04, with an English abstract, total 5 pages.
(Continued)

*Primary Examiner* — Fritz Alphonse
(74) *Attorney, Agent, or Firm* — Leydig, Voit & Mayer, Ltd.

(57) ABSTRACT

A decoding method and apparatus are provided, to improve a degree of parallelism in decoded bit decisions and reduce a decoding delay. The method includes: performing a hard decision on each LLR in an inputted LLR vector having a length of M to obtain a first vector, where M≤N and N is a length of to-be-decoded information; sequentially performing negation of some elements of the first vector to obtain L vectors; and then determining decoding results of the LLR vector based on the L vectors.

8 Claims, 13 Drawing Sheets

(58) Field of Classification Search
USPC .................................. 714/776, 778, 783, 773
See application file for complete search history.

(56) References Cited

U.S. PATENT DOCUMENTS

| | | | |
|---|---|---|---|
| 2005/0001745 A1* | 1/2005 | Sankaran | H04N 19/61 |
| | | | 341/107 |
| 2011/0252286 A1 | 10/2011 | Li et al. | |
| 2016/0056843 A1 | 2/2016 | Gross et al. | |
| 2017/0222754 A1 | 8/2017 | Noh et al. | |
| 2017/0353194 A1 | 12/2017 | Tao et al. | |

FOREIGN PATENT DOCUMENTS

| | | |
|---|---|---|
| CN | 104242957 A | 12/2014 |
| CN | 106788453 A | 5/2017 |
| CN | 107040262 A | 8/2017 |
| CN | 107425857 A | 12/2017 |
| CN | 107528597 A | 12/2017 |

OTHER PUBLICATIONS

Yoo et al.,"Efficient Pruning for Successive-Cancellation Decoding of Polar Codes," IEEE Communications Letters vol. 20, No. 12, pp. 1-4, Institute of Electrical and Electronics Engineers, New York, New York (Dec. 2016).

Sarkis et al.,"Fast List Decoders for Polar Codes," IEEE Journal On Selected Areas in Communications, vol. 34, No. 2, pp. 318-328, Institute of Electrical and Electronics Engineers, New York, New York (Feb. 2016).

Xu et al.,"A complexity-reduced fast successive cancellation list decoder for polar codes," Science China Information Sciences, vol. 61, 022309:1-022309:11, total 11 pages (Feb. 2018).

He et al., "A CRC-SCL based Decoding Algorithm of Polar Codes," Study on Optical Communications, Sum. No. 200, School of Communication Engineering, Apr. 2017, with an English abstract, total 5 pages.

* cited by examiner

DECODING METHOD AND APPARATUS

CROSS-REFERENCE TO RELATED APPLICATIONS

This application is a continuation of International Application No. PCT/CN2018/124375, filed on Dec. 27, 2018, which claims priority to Chinese Patent Application No. 201810020396.4, filed on Jan. 9, 2018. The disclosures of the aforementioned applications are hereby incorporated by reference in their entireties.

TECHNICAL FIELD

This application relates to the field of encoding and decoding technologies, and in particular, to a decoding method and apparatus.

BACKGROUND

Rapid evolution of wireless communication indicates that a 5th generation (5G) communications system presents some new features. Most typical three communication scenarios include enhanced mobile broadband (eMBB), massive machine-type communications (mMTC), and ultra-reliable low-latency communication (URLLC).

Requirements of these communication scenarios pose new challenges to an existing long term evolution (LTE) technology. As a most basic wireless access technology, channel encoding is one of important research objects that meet 5G communication requirements. A polar code is selected as a control channel encoding scheme in a 5G standard. The polar code is the first and only known channel encoding method that can be strictly proved to "reach" a channel capacity. Under different code lengths, especially for a finite code, performance of the polar code is far better than that of a turbo code and a low density parity check (LDPC) code. In addition, the polar code has relatively low computational complexity in terms of encoding and decoding. These advantages enable the polar code to have great development and application prospects in 5G.

In a polar code decoding method, a decoding process of an existing successive cancellation (SC) decoding method is as follows: After to-be-decoded information (including an information bit and a fixed bit) is received, for the information bit in the to-be-decoded information, a log likelihood ratio (LLR) of each information bit is calculated one by one, and a bit-by-bit decision is performed. If an LLR of the information bit is greater than 0, a decoding result is 0; or if an LLR of the information bit is less than 0, a decoding result is 1. For the fixed bit in the to-be-decoded information, regardless of a value of an LLR, a decoding result is set to 0. All bits are sequentially decoded, and a result of a former decoded bit is used as an input for calculating a latter decoded bit. Once there is a decision error, error extension is caused, and there is no opportunity for recovery. Consequently, decoding performance is not high. To resolve this problem, in a successive cancellation list (SCL) algorithm, when the SCL algorithm decodes each information bit, decoding results corresponding to 0 and 1 are both stored as two branch decoding paths (path splitting for short). FIG. 1 is a schematic diagram of a decoding path in an SCL algorithm. As shown in FIG. 1, each level represents one decoded bit. If a decoding result is 0, a path is developed along a left subtree; or if a decoding result is 1, a path is developed along a right subtree. When a total quantity of decoding paths exceeds a preset path width L (usually, $L=2^l$), L paths having optimal path metric (PM) values are selected and stored, and a path continues to be developed to decode a subsequent decoded bit. A PM value is used to determine quality of a path, the PM value is obtained through LLR calculation. For a decoded bit at each level, the PM values of the L paths are sorted in ascending order, and a correct path is selected by using the PM values. This process is repeated until the last bit is decoded.

In actual application, a quantity of decoded bits is very large. By using an SCL decoding method, for each decoded bit, PM values of all paths corresponding to each decoded bit need to be calculated, and all the paths are sorted once based on the PM values. Consequently, both computational complexity of the SCL decoding method and a decoding delay caused by sorting are high.

SUMMARY

Embodiments of this application provide a decoding method and apparatus, to improve a degree of parallelism in decoded bit decisions and reduce a decoding delay.

Specific technical solutions provided in the embodiments of this application are as follows:

According to a first aspect, a decoding method is provided. The method is performed by a decoding device, and the decoding device implements the method by performing the following steps: performing a hard decision on each LLR in an inputted LLR vector to obtain an original vector, where a length of the LLR vector is M, M≤N, N is a length of to-be-decoded information, and N and M are 2 raised to the power of a positive integer; determining Y to-be-diagnosed vectors based on the original vector, where the to-be-diagnosed vector is obtained by performing negation on at least 0 of X elements in the original vector, locations of the X elements in the original vector are consistent with locations of the first X LLRs sorted in ascending order of absolute values in the LLR vector, and $Y \leq 2^X$; determining at least one candidate vector based on each of the Y to-be-diagnosed vectors, where a manner of determining the at least one candidate vector based on any to-be-diagnosed vector is: determining an intermediate decoding vector of the to-be-diagnosed vector based on a generator matrix; selecting a symptom vector from the intermediate decoding vector based on locations of frozen bits; selecting at least one diagnosis vector from a symptom diagnosis table based on the symptom vector; and performing an exclusive OR operation on each diagnosis vector and the to-be-diagnosed vector to obtain the at least one candidate vector, where the symptom diagnosis table includes a correspondence between a symptom vector and a diagnosis vector; and selecting L candidate vectors from at least Y candidate vectors obtained by using the Y to-be-diagnosed vectors, and determining decoding results of the LLR vector based on the L candidate vectors. By using the foregoing steps, processes such as path splitting, PM value accumulation, error correction, and a bit decision may be moved from the last level to an intermediate level. If a quantity of intermediate-level LLRs may be any value, a parallel decision for the to-be-decoded information or a to-be-decoded code subblock that includes any quantity of information bits helps reduce computational complexity. Especially, when M is greater than 4, by using the foregoing decoding method, the computational complexity can be greatly reduced relative to an exhaustive expansion manner of an existing ML decoding method.

In a possible design, if a first bit sequence corresponding to the LLR vector is different from a specified second bit sequence, interleaving processing is performed on the inputted LLR vector, and a hard decision is performed on each LLR in an LLR vector obtained after the interleaving processing, to obtain the original vector, where the same interleaving processing is performed on the first bit sequence to obtain the second bit sequence, and the locations of the frozen bits are determined based on the second bit sequence; and de-interleaving processing is performed on each of the L candidate vectors, and the decoding results of the LLR vector is determined based on L candidate vectors obtained after the de-interleaving processing. In this way, the decoding results can be obtained for the inputted LLR vector by using the symptom diagnosis table corresponding to an information bit location.

In a possible design, if there is a duplicate candidate vector in the at least Y candidate vectors obtained by using the Y to-be-diagnosed vectors, deduplication processing is performed on the at least Y candidate vectors, and the L candidate vectors are selected from candidate vectors obtained after the deduplication processing, where any two of the candidate vectors obtained after the deduplication processing are different. In this way, the L candidate vectors can be selected to avoid a case in which a quantity of selected candidate vectors is less than L due to duplication.

Optionally, negation is performed on the X elements in the original vector to obtain deduplicated vectors, the locations of the X elements in the original vector are consistent with the locations of the first X LLRs sorted in ascending order of absolute values in the LLR vector, and an "AND" operation is performed on a diagnosis vector and a deduplicated vector. If there are elements including 1 in an obtained result vector, the corresponding diagnosis vector is marked as an unusable vector, or a PM value of a candidate vector obtained by using the corresponding diagnosis vector is set to infinity. In this way, these vectors are filtered out when a better path is selected based on PM values.

In a possible design, a diagnosis vector in a $2i^{th}$ row in the symptom diagnosis table is prestored, a diagnosis vector in a $(2i+1)^{th}$ row in the symptom diagnosis table is obtained through online computing, a manner of the online computing is performing negation on the last element in the stored diagnosis vector in the $2i^{th}$ row, and i is a nonnegative integer. In this way, storage space can be saved.

Optionally, the symptom diagnosis table stores only all information in the first row, all information in the first column, and a correspondence between each i in each row and j in the zeroth row. In this way, the storage space can be further saved.

In a possible design, if a shortening encoding scheme is used on an encoding side, there may be a shortening bit in each of decoding results of the to-be-decoded information or the to-be-decoded code subblock. In this case, each of the obtained L candidate vectors is compared with a location of the shortening bit, and an unmatched candidate vector is deleted, or a PM value of the unmatched candidate vector is marked as infinity. The unmatch means that an element at the location of the shortening bit in a candidate vector is not 0.

According to a second aspect, a decoding method is provided. The method is performed by a decoding device, and the decoding device implements the method by performing the following steps: performing a hard decision on each LLR in an inputted LLR vector to obtain a first vector, where a length of the LLR vector is M, K=M≤N, N is a length of to-be-decoded information, N and M are 2 raised to the power of a positive integer, and K is a length of information bits; sequentially performing at least the first (L−1) of the following operations: performing negation on a first element in the first vector to obtain a second vector; performing negation on a second element in the first vector to obtain a third vector; performing negation on a third element in the first vector to obtain a fourth vector; performing negation on a fourth element in the first vector to obtain a fifth vector; performing negation on a fifth element in the first vector to obtain a sixth vector; performing negation on a sixth element in the first vector to obtain a seventh vector; performing negation on a seventh element in the first vector to obtain an eighth vector; performing negation on the first element and the second element in the first vector to obtain a ninth vector; performing negation on the first element and the third element in the first vector to obtain a tenth vector; performing negation on the first element and the fourth element in the first vector to obtain an eleventh vector; performing negation on the second element and the third element in the first vector to obtain a twelfth vector; and performing negation on the first element, the second element, and the third element in the first vector to obtain a thirteenth vector, where locations of the first element to an $X^{th}$ element in the first vector correspond to locations of the first X LLRs sorted in ascending order of absolute values in the LLR vector; and sequentially selecting the first L vectors from obtained vectors, where the selection starts from the first vector, and determining decoding results of the LLR vector based on the L vectors. By using the foregoing steps, processes such as path splitting, PM value accumulation, error correction, and a bit decision may be moved from the last level to an intermediate level. If a quantity of intermediate-level LLRs may be any value, a parallel decision for the to-be-decoded information or a to-be-decoded code subblock that includes any quantity of information bits helps reduce computational complexity. Especially, when M is greater than 4, by using the foregoing decoding method, the computational complexity can be greatly reduced relative to an exhaustive expansion manner of an existing ML decoding method.

In a possible design, if X=7, the first seven LLRs sorted in ascending order of absolute values in the LLR vector are assumed to be represented by [LLR 0, LLR 1, LLR 2, . . . , LLR 6]. In this case, locations of the first element to the seventh element in the first vector are in a one-to-one correspondence with locations of the [LLR 0, LLR 1, LLR 2, . . . , LLR 6] in the LLR vector. In other words, a location of the first element in the first vector is consistent with a location of the LLR 0 in the LLR vector, and a location of the second element in the first vector is consistent with a location of the LLR 1 in the LLR vector. Similarly, locations of other elements are determined.

According to a third aspect, a decoding method is provided. The method is performed by a decoding device, and the decoding device implements the method by performing the following steps: performing a hard decision on each LLR in an inputted log likelihood ratio LLR vector to obtain a first vector, where a length of the LLR vector is M, (K+1)=M≤N, N is a length of to-be-decoded information, N and M are 2 raised to the power of a positive integer, and K is a length of an information bit; performing parity check on the first vector, and if the check succeeds, sequentially performing at least the first (L−1) of the following operations: performing negation on a first element and a second element in the first vector to obtain a second vector; performing negation on the first element and a third element in the first vector to obtain a third vector; performing negation on the first element and a fourth element in the first vector to obtain a fourth vector; performing negation on the first element and a fifth element in the first vector to obtain a fifth vector; performing negation on the first element and a sixth element in the first vector to obtain a sixth vector; performing negation on the first element and a seventh element in the first vector to obtain a seventh vector; performing negation on the first element and an eighth element in the first vector to obtain an eighth vector; performing negation on the second element and the third element in the first vector to obtain a ninth vector; performing negation on the second element and the fourth element in the first vector to obtain a tenth vector; performing negation on the second element and the fifth element in the first vector to obtain an eleventh vector; performing negation on the third element and the fourth element in the first vector to obtain a twelfth vector; and performing negation on the first element to the fourth element in the first vector to obtain a thirteenth vector, where locations of the first element to an $X^{th}$ element in the first vector correspond to locations of the first X LLRs sorted in ascending order of absolute values in the LLR vector; and sequentially selecting the first L vectors from obtained vectors, where the selection starts from the first vector, and determining decoding results of the LLR vector based on the L vectors. By using the foregoing steps, processes such as path splitting, PM value accumulation, error correction, and a bit decision may be moved from the last level to an intermediate level. If a quantity of intermediate-level LLRs may be any value, a parallel decision for the to-be-decoded information or a to-be-decoded code subblock that includes any quantity of information bits helps reduce computational complexity. Especially, when M is greater than 4, by using the foregoing decoding method, the computational complexity can be greatly reduced relative to an exhaustive expansion manner of an existing ML decoding method.

In a possible design, if the check fails, at least the first L of the following operations are sequentially performed: performing negation on a first element in the first vector to obtain a second vector; performing negation on a second element in the first vector to obtain a third vector; performing negation on a third element in the first vector to obtain a fourth vector; performing negation on a fourth element in the first vector to obtain a fifth vector; performing negation on a fifth element in the first vector to obtain a sixth vector; performing negation on a sixth element in the first vector to obtain a seventh vector; performing negation on a seventh element in the first vector to obtain an eighth vector; performing negation on an eighth element in the first vector to obtain a ninth vector; performing negation on the first element, the second element, and the third element in the first vector to obtain a tenth vector; performing negation on the first element, the second element, and the fourth element in the first vector to obtain an eleventh vector; performing negation on the first element, the third element, and the fourth element in the first vector to obtain a twelfth vector; performing negation on the second element, the third element, and the fourth element in the first vector to obtain a thirteenth vector; and performing negation on the first element, the second element, and the fifth element in the first vector to obtain a fourteenth vector, where locations of the first element to an $X^{th}$ element in the first vector correspond to locations of the first X LLRs sorted in ascending order of absolute values in the LLR vector; and the first L vectors are sequentially selected from obtained vectors, where the selection starts from the second vector, and decoding results of the LLR vector are determined based on the L vectors.

According to a fourth aspect, a decoding method is provided. The method is performed by a decoding device, and the decoding device implements the method by performing the following steps: receiving to-be-decoded information, where a length of the to-be-decoded information is N, the to-be-decoded information includes Q code subblocks, a length of one code subblock is M, M≤N, and M is 2 raised to the power of a positive integer; determining L first candidate vectors for any one of the Q code subblocks; and selecting, as decoding results of the to-be-decoded information, L second candidate vectors having optimal PM values from valid candidate vectors in Q*L first candidate vectors determined for the Q code subblocks, where locations of housekeeping bits in candidate results determined by the valid candidate vectors and a generator matrix conform to a setting on an encoding side. In this way, error detection can be performed on the decoding results by comparison, thereby avoiding a problem of a CRC false alarm.

In a possible design, a method for determining the L first candidate vectors based on the any code subblock is performed according to the method for determining the L candidate vectors in the method according to any one of the first aspect or the possible designs of the first aspect, is performed according to the method for determining the L vectors according to any one method of the second aspect or the possible designs of the second aspect, or is performed according to the method for determining the L vectors according to any one method of the third aspect or the possible designs of the third aspect.

According to a fifth aspect, a decoding apparatus is provided. The apparatus has functions of implementing the method according to any one of the first aspect and the possible designs of the first aspect. The functions may be implemented by hardware, or may be implemented by hardware by executing corresponding software. The hardware or the software includes one or more modules corresponding to the foregoing functions.

In a possible design, when some or all of the functions are implemented by hardware, the decoding apparatus includes: an input interface circuit, configured to obtain to-be-decoded information; a logic circuit, configured to perform the behavior according to any one of the first aspect and the possible designs of the first aspect; and an output interface circuit, configured to output decoding results.

Optionally, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus may implement the method according to any one of the first aspect and the possible designs of the first aspect.

Optionally, the memory may be a physically independent unit, or may be integrated with the processor.

In a possible design, when some or all of the functions are implemented by software, the decoding apparatus includes the processor. The memory configured to store the program is located outside the decoding apparatus. The processor is connected to the memory by using a circuit/wire, and is configured to read and execute the program stored in the memory.

According to a sixth aspect, a decoding apparatus is provided. The apparatus has functions of implementing the method according to any one of the second aspect and the possible designs of the second aspect. The functions may be implemented by hardware, or may be implemented by hardware by executing corresponding software. The hardware or the software includes one or more modules corresponding to the foregoing functions.

In a possible design, when some or all of the functions are implemented by hardware, the decoding apparatus includes: an input interface circuit, configured to obtain to-be-decoded information; a logic circuit, configured to perform the behavior according to any one of the second aspect and the possible designs of the second aspect; and an output interface circuit, configured to output decoding results.

Optionally, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus may implement the method according to any one of the second aspect and the possible designs of the second aspect.

Optionally, the memory may be a physically independent unit, or may be integrated with the processor.

In a possible design, when some or all of the functions are implemented by software, the decoding apparatus includes the processor. The memory configured to store the program is located outside the decoding apparatus. The processor is connected to the memory by using a circuit/wire, and is configured to read and execute the program stored in the memory.

According to a seventh aspect, a decoding apparatus is provided. The apparatus has functions of implementing the method according to any one of the third aspect and the possible designs of the third aspect. The functions may be implemented by hardware, or may be implemented by hardware by executing corresponding software. The hardware or the software includes one or more modules corresponding to the foregoing functions.

In a possible design, when some or all of the functions are implemented by hardware, the decoding apparatus includes: an input interface circuit, configured to obtain to-be-decoded information; a logic circuit, configured to perform the behavior according to any one of the third aspect and the possible designs of the third aspect; and an output interface circuit, configured to output decoding results.

Optionally, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus may implement the method according to any one of the third aspect and the possible designs of the third aspect.

Optionally, the memory may be a physically independent unit, or may be integrated with the processor.

In a possible design, when some or all of the functions are implemented by software, the decoding apparatus includes the processor. The memory configured to store the program is located outside the decoding apparatus. The processor is connected to the memory by using a circuit/wire, and is configured to read and execute the program stored in the memory.

According to an eighth aspect, a decoding apparatus is provided. The apparatus has functions of implementing the method according to any one of the fourth aspect and the possible designs of the fourth aspect. The functions may be implemented by hardware, or may be implemented by hardware by executing corresponding software. The hardware or the software includes one or more modules corresponding to the foregoing functions.

In a possible design, when some or all of the functions are implemented by hardware, the decoding apparatus includes: an input interface circuit, configured to obtain to-be-decoded information; a logic circuit, configured to perform the behavior according to any one of the fourth aspect and the possible designs of the fourth aspect; and an output interface circuit, configured to output decoding results.

Optionally, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus may implement the method according to any one of the fourth aspect and the possible designs of the fourth aspect.

Optionally, the memory may be a physically independent unit, or may be integrated with the processor.

In a possible design, when some or all of the functions are implemented by software, the decoding apparatus includes the processor. The memory configured to store the program is located outside the decoding apparatus. The processor is connected to the memory by using a circuit/wire, and is configured to read and execute the program stored in the memory.

According to a ninth aspect, a communications system is provided. The communications system includes a network device and a terminal, and both the network device and the terminal may perform the methods according to the foregoing aspects or possible designs.

According to a tenth aspect, a computer storage medium is provided, and stores a computer program. The computer program includes an instruction used to perform the methods according to the foregoing aspects or possible designs.

According to an eleventh aspect, a computer program product including an instruction is provided. When the computer program product runs on a computer, the computer is enabled to perform the methods according to the foregoing aspects.

DESCRIPTION OF EMBODIMENTS

This application provides a decoding method and apparatus, to increase the length of bits decoded in parallel in a decoding process, reduce the decoding depth, reduce computational complexity of decoding, and reduce a decoding delay while ensuring decoding performance. The method and the apparatus are based on a similar concept. The method and the apparatus have similar problem-resolving principles. Therefore, for implementation of the method and the apparatus, refer to each other. Repeated content is not described again.

The following explains and describes some terms in this application and basic knowledge of a polar code, to facilitate understanding of persons skilled in the art.

(1) Polar Code

The polar code is the first channel encoding method that can be theoretically proved to "reach" a channel capacity. The polar code is a linear block code, a generator matrix of the polar code is $G_N$, an encoding process of the polar code is $x_1^N = u_1^N G_N$, $u_1^N = (u_1, u_2, K, u_N)$ is a binary row vector, and the length of the polar code vector is N (namely, the code length). In addition, $G_N = B_N F_2^{\otimes(\log_2(N))}$. Herein, $$F_2 = \begin{bmatrix} 1 & 0 \\ 1 & 1 \end{bmatrix},$$

and $B_N$ is a transposed matrix of N×N, for example, a bit reversal order transposed matrix. $B_N$ is an optional parameter, and an operation of $B_N$ may be omitted in an operation process of the generator matrix $G_N$. $F_2^{\otimes(\log_2(N))}$ is defined as a Kronecker product of $\log_2 N$ matrices $F_2$, $x_1^N$ is an encoded bit (also referred to as a code word), and the encoded bit is obtained by multiplying $u_1^N$ by the generator matrix $G_N$. A multiplication process is the encoding process. In a polar code encoding process, a part of bits in $u_1^N$ are used to carry information and are referred to as information bits, and a set of indexes of the information bits is marked as A. The other part of bits in $u_1^N$ are set to fixed values that are agreed on by a transmit end and a receive end in advance, and are referred to as fixed bits, and a set of indexes of the fixed bits is represented by a complementary set $A^c$ of A. A fixed bit is usually set to 0. A fixed bit sequence may be set to any value provided that the value is agreed on by the transmit end and the receive end.

(2) Existing SC Decoding Method

Figure 2:
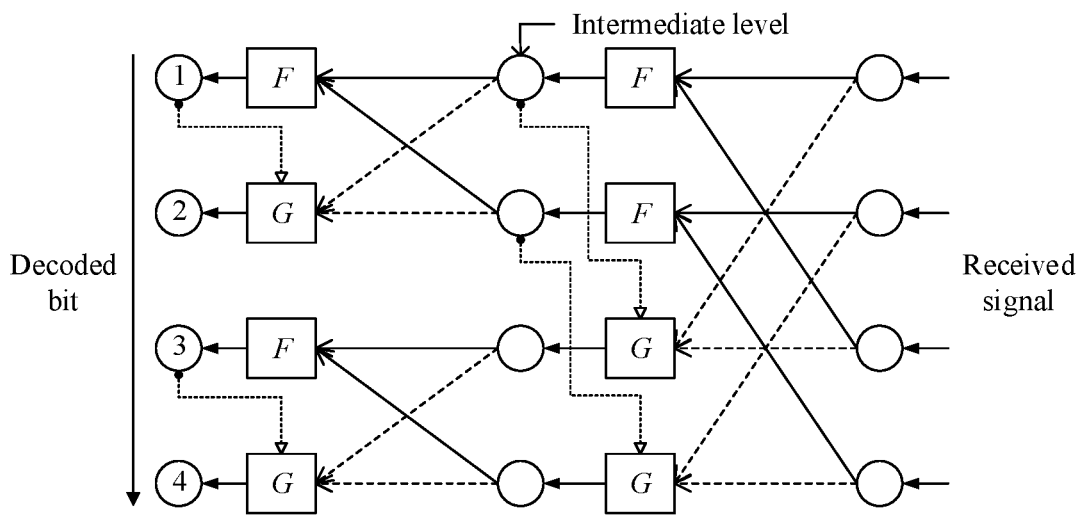
FIG. 2 is a schematic diagram of an SC decoding method in the prior art.

After a signal is received, an LLR of an information bit is calculated one by one. If the LLR of the information bit is greater than 0, a decoding result is 0; or if the LLR of the information bit is less than 0, a decoding result is 1. A decoding result of a fixed bit is set to 0 regardless of a value of an LLR. FIG. 2 is a schematic diagram of an SC decoding calculation process. An example of four decoded bits is used. There are eight computing nodes in total in FIG. 2, there are four F nodes and four G nodes, and an F node and a G node respectively correspond to an F function and a G function. Calculation at the F node requires two LLR inputs on the right side of the F node. Calculation at the G node requires two LLR inputs on the right side of the G node and an upper-level output that is also used as an input. An output can be calculated only after input calculation is completed. According to the foregoing calculation rule, in FIG. 2, calculation at the eight nodes is sequentially performed starting from a received signal on the right side, and obtained decoded bits are sequentially ①→②→③→④. In this case, decoding is completed.

(3) Existing SCL Decoding Method

Figure 1:
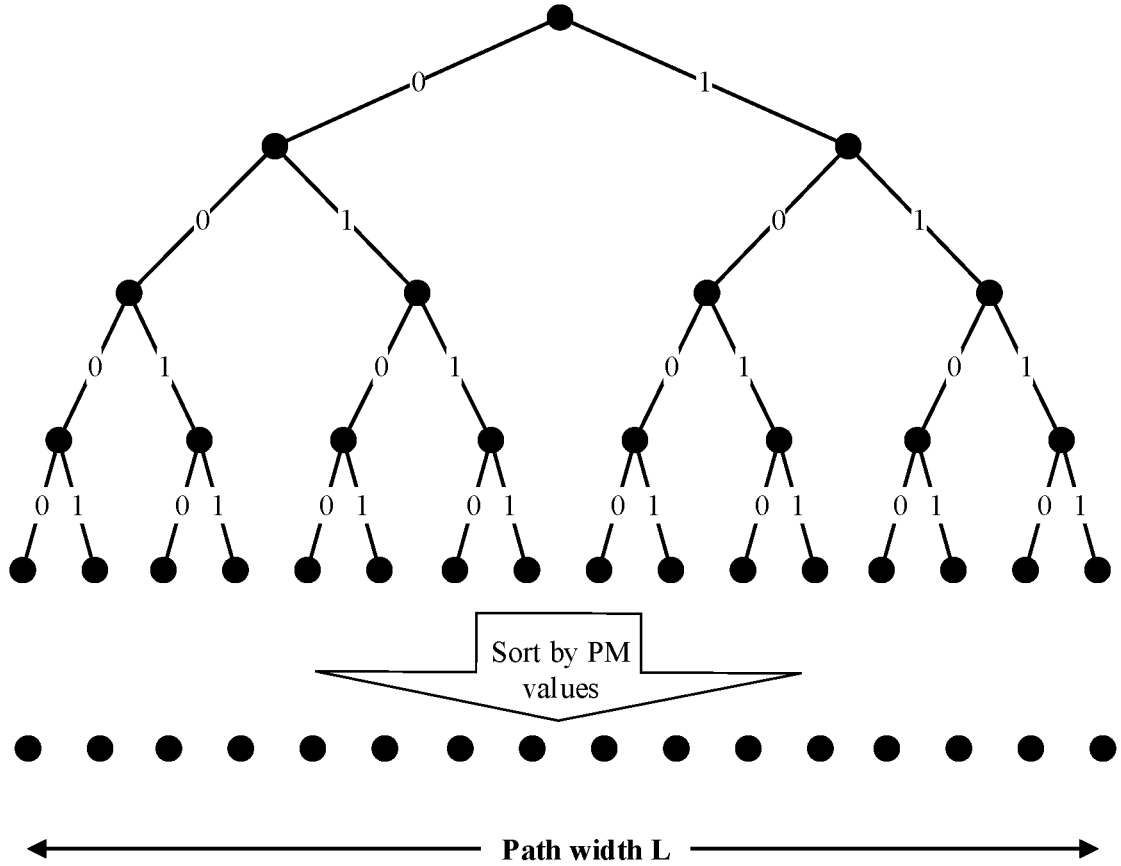
FIG. 1 is a schematic diagram of an SCL decoding method in the prior art.

Details are described in the method shown in FIG. 1, and are not described herein again.

(4) To-be-Decoded Information

In this application, the to-be-decoded information is also referred to as a to-be-decoded code word, a to-be-decoded code block, a code word, or a code block. The to-be-decoded information may be divided into a plurality of code sub-blocks for parallel decoding processing. The length of the to-be-decoded information is represented by N, and the length of a code subblock for parallel decoding is represented by M. A quantity of information bits included in the to-be-decoded code subblock having the length of M is represented by K.

(5) In descriptions of this application, the character "/" usually indicates an "or" relationship between associated objects. Words such as "first" and "second" are merely used for distinction and description, and shall not be understood as an indication or implication of relative importance or an indication or implication of an order.

The following describes in detail embodiments of this application with reference to the accompanying drawings.

The following describes an architecture of a communications system to which the embodiments of this application are applied.

Figure 3:
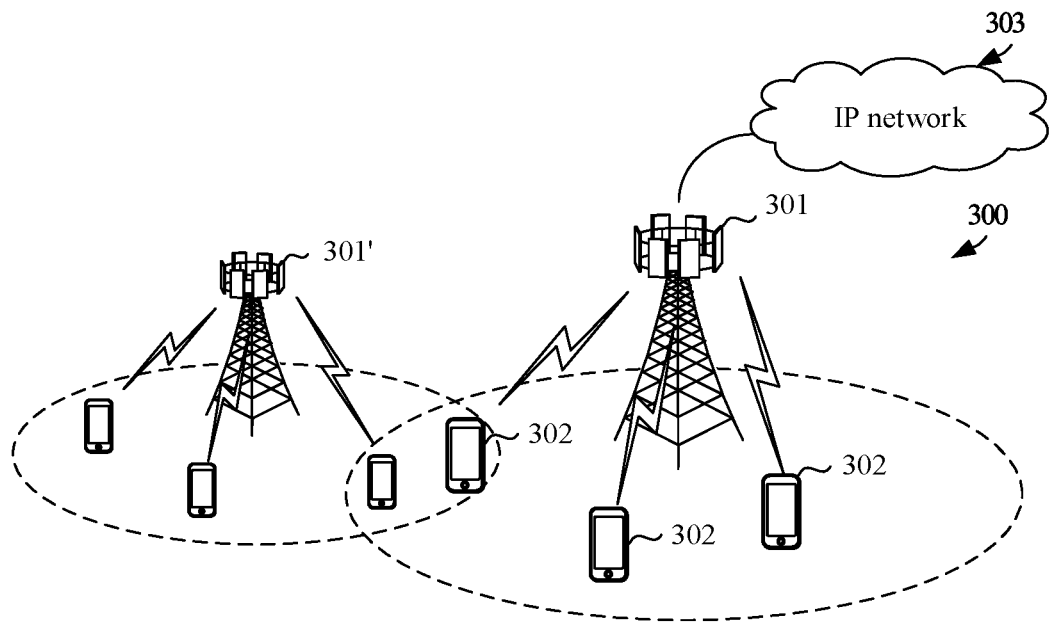
FIG. 3 is a schematic architectural diagram of a communications system according to an embodiment of this application.

FIG. 3 shows an architecture of a possible communications system to which decoding methods provided in embodiments of this application are applied. Refer to FIG.

3. A communications system 300 includes a network device 301 and one or more terminals 302. When the communications system 300 includes a core network, the network device 301 may be further connected to the core network. The network device 301 may communicate with an IP network 303. For example, the IP network 303 may be the internet, a private IP network, or another data network. The network device 301 provides a service for the terminal 302 within coverage. For example, refer to FIG. 3. The network device 301 provides wireless access for the one or more terminals 302 within the coverage of the network device 301. In addition, there may be an overlapping area between coverage of network devices, for example, the network device 301 and a network device 301'. The network devices may further communicate with each other. For example, the network device 301 may communicate with the network device 301'.

The network device 301 is a device that connects the terminal 302 to a wireless network in the communications system to which this application is applied. The network device 301 is a node in a radio access network (RAN), and may also be referred to as a base station, and may also be referred to as a RAN node (or device). Currently, some examples of the network device 301 are: a gNB/an NR-NB, a transmission reception point (TRP), an evolved NodeB (eNB), a radio network controller (RNC), a NodeB (NB), a base station controller (BSC), a base transceiver station (BTS), a home base station (for example, a home evolved NodeB, or a home NodeB, HNB), a base band unit (BBU), a wireless fidelity (Wi-Fi) access point (AP), a network side device in a 5G communications system or a possible future communications system, and the like.

The terminal 302 is also referred to as user equipment (UE), a mobile station (MS), a mobile terminal (MT), or the like, and is a device that provides a user with voice and/or data connectivity. For example, the terminal 302 includes a handheld device or a vehicle-mounted device having a wireless connection function. Currently, the terminal 302 may be a mobile phone, a tablet computer, a notebook computer, a palmtop computer, a mobile internet device (MID), a wearable device (such as a smartwatch, a smart band, or a pedometer), a vehicle-mounted device (such as a device mounted on a car, a bicycle, an electric vehicle, an airplane, a ship, a train, or a high-speed train), a virtual reality (VR) device, an augmented reality (AR) device, a wireless terminal in industrial control, a smart home device (such as a refrigerator, a television, an air conditioner, or an electricity meter), an intelligent robot, a workshop device, a wireless terminal in self driving, a wireless terminal in a remote medical surgery, a wireless terminal in a smart grid, a wireless terminal in transportation safety, a wireless terminal in a smart city, a wireless terminal in a smart home, a flight device (such as an intelligent robot, a hot balloon, an unmanned aerial vehicle, or an aircraft), or the like.

The decoding methods provided in the embodiments of this application may be performed by the network device 301, or may be performed by the terminal 302. The decoding methods provided in the embodiments of this application are applicable to various wireless communication scenarios, which may include but are not limited to scenarios applicable to enhanced mobile broadband (eMBB), massive machine-type communications (mMTC), and ultra-reliable low-latency communication (URLLC).

The following briefly describes a basic idea of the embodiments of this application.

It is assumed that the length of to-be-decoded information is N, and N may also be considered as the mother code length of a polar code. The to-be-decoded information is decoded to obtain decoding results (namely, decoded bits). A transmit end and a receive end agree on a location of a fixed bit in advance, and the fixed bit is usually set to 0. Content of an information bit actually needs to be obtained in a decoding process. In actual application, a value of N may be very large. If an existing SCL decoding method is used, an LLR vector whose length is N and that corresponds to the to-be-decoded information reaches the last level after a plurality of levels of F/G operations, and a bit decision is performed on an LLR at the last level to obtain one decoded bit. Path splitting is performed bit by bit. When a quantity of paths is greater than L, L optimal paths are selected based on PM values, and the path splitting continues to be performed. Consequently, computational complexity is extremely high. In the embodiments of this application, a parallel decision is performed on M bits, and M≤N. When M=N, the length of an LLR vector at a level corresponding to a received signal is M; or when M<N, an LLR vector whose length is N and that corresponds to the to-be-decoded information reaches a level after one or more levels of F/G operations, and the length of an LLR vector at the level is M. Path splitting is performed at the level with the LLR vector having the length of M. When a quantity of information bits in a code block or a code subblock corresponding to the level is relatively large, a quantity of split paths increases exponentially. The methods provided in this application are used to help reduce the quantity of split paths and reduce the computational complexity.

Figure 4:
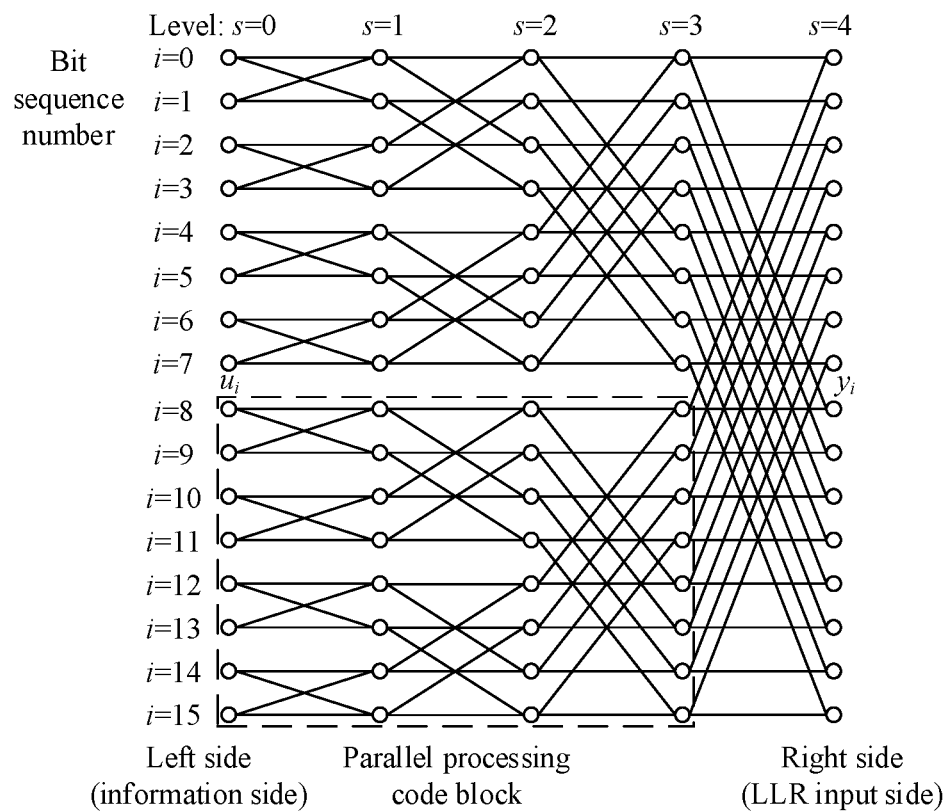
FIG. 4 is a schematic diagram of a partial decoding process according to an embodiment of this application.

With reference to FIG. 4, a concept of a level in the foregoing description is described below. As shown in FIG. 4, the right side is an LLR input side, or referred to as a code word side. The left side is an information side, or referred to as a decoded bit side. yi is to-be-decoded information, and ui is a decoded bit. Starting from decoding, levels are sequentially s=4, s=3, s=2, s=1, and s=0. It is assumed that the length N of the to-be-decoded information is equal to 16. In this case, if an existing SCL decoding method is used, an F/G operation is performed, at a level of s=4, on 16 LLRs corresponding to the to-be-decoded information, to obtain eight LLRs at a level of s=3. In this case, an F/G operation continues to be performed on the eight LLRs at the level of s=3 to obtain four LLRs at a level of s=2. An F/G operation continues to be performed on the four LLRs at the level of s=2 to obtain two LLRs at a level of s=1. An F/G operation continues to be performed on the two LLRs at a level of s=1 to obtain one LLR at the level of s=0, and path splitting is performed at the level of s=1 bit by bit.

In the embodiments of this application, path splitting is directly performed at a level with M LLRs, so that a parallel decision is performed on M decoded bits. As shown in FIG. 4, if M=16, path splitting is directly performed at the level of s=4 by using the method provided in this application, so that a parallel decision is performed on 16 decoded bits. If M=8, path splitting is directly performed at the level of s=3 by using the method provided in this application, so that a parallel decision is performed on eight decoded bits. Certainly, N and M may be other values, for example, N=32, 64, 128, 256, 512, or 1024. M may be a quantity of LLRs at any level reached by performing an F/G operation on N LLRs. In the embodiments of this application, both N and M are 2 raised to the power of a positive integer.

The following describes in detail the decoding methods provided in the embodiments of this application.

Figure 5:
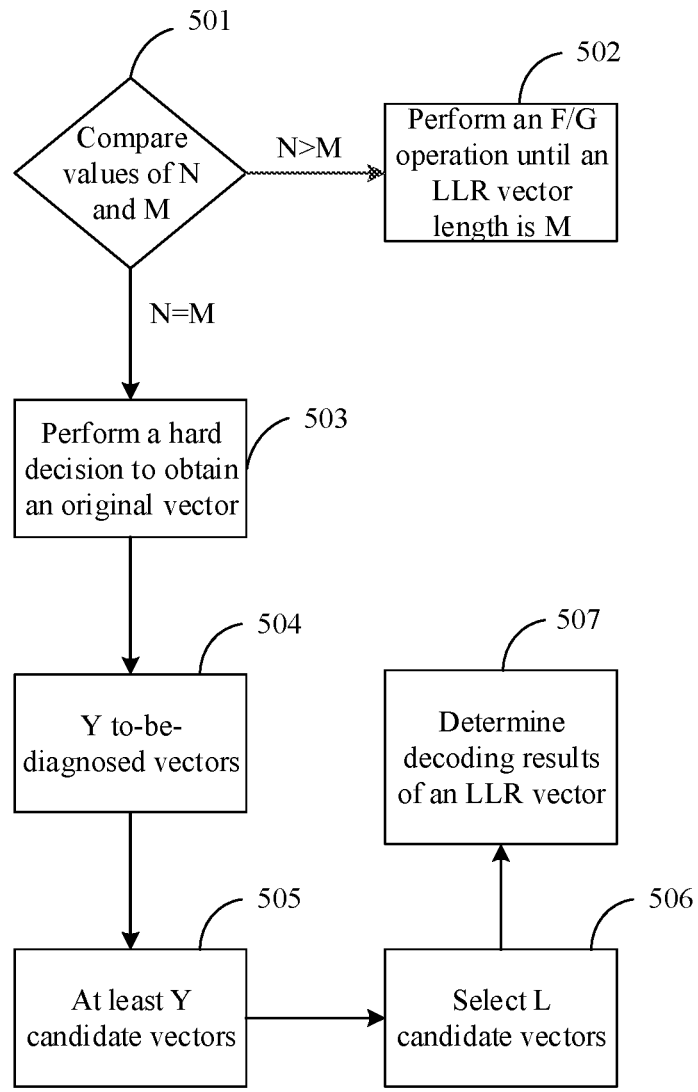
FIG. 5 is a first schematic diagram of a decoding method according to an embodiment of this application.

As shown in FIG. 5, a decoding method provided in an embodiment of this application is specifically described as follows. The decoding method is performed by a decoding device. The decoding device may be a network device 301 shown in FIG. 3, or may be a terminal 302 shown in FIG. 3.

In the following description, at least any two consecutive steps may independently form a solution that needs to be protected in the embodiments of this application. For example, step 503 to step 507 form a set of solution, and step 501 and step 502 are optional steps.

Step 501: Determine a value relationship between the length N of to-be-decoded information and M. If the length N of the to-be-decoded information is greater than M, step 502 is performed; or if the length N of the to-be-decoded information is equal to M, step 503 is performed.

Step 502: Perform, level by level, at least one level of F/G operation on N LLRs corresponding to the to-be-decoded information until the length of an LLR vector at a level after the F/G operation is equal to M, and perform step 503.

Step 503: Perform a hard decision on each LLR in the inputted LLR vector to obtain an original vector.

The length of the original vector is M.

A hard decision method is described herein. The hard decision is performed on each of M LLRs corresponding to the to-be-decoded information or to-be-decoded code subblocks, and a hard decision function used for the hard decision may be $$h(x) = \begin{cases} 0, & x > 0 \\ 1, & x < 0, \\ 0 \text{ or } 1, & x = 0 \end{cases}$$

where x is a value of an LLR.

Step 504: Determine Y to-be-diagnosed vectors based on the original vector.

The length of a to-be-diagnosed vector is M.

Specifically, the to-be-diagnosed vector is obtained by performing negation on at least 0 of X elements in the original vector, locations of the X elements in the original vector are consistent with locations of the first X LLRs sorted in ascending order of absolute values in the LLR vector, and $Y \leq 2^X$. Negation means that an element 0 is changed to 1, and an element 1 is changed to 0.

A value of X may be randomly adjusted. A larger value of X indicates higher decoding precision and higher computational complexity. A smaller value of X indicates lower decoding precision and lower computational complexity. Correspondingly, a value of Y may also be adjusted. Usually, the value of Y is $2^X$. The value of Y may alternatively be less than $2^X$. A larger value of Y indicates higher decoding precision and higher computational complexity. A smaller value of Y indicates lower decoding precision and lower computational complexity. Values of X and Y may be determined based on a balance between decoding precision and computational complexity.

Step 505: Determine at least one candidate vector based on each of the Y to-be-diagnosed vectors.

Specifically, a manner of determining the at least one candidate vector based on any to-be-diagnosed vector is: determining an intermediate decoding vector of the to-be-diagnosed vector based on a generator matrix; selecting a symptom vector from the intermediate decoding vector based on locations of frozen bits; selecting at least one diagnosis vector from a symptom diagnosis table based on the symptom vector; and performing an exclusive OR operation on each diagnosis vector and the to-be-diagnosed vector to obtain the at least one candidate vector. In this way, at least Y candidate vectors may be obtained based on the Y to-be-diagnosed vectors. The symptom diagnosis table includes a correspondence between a symptom vector and a diagnosis vector. The generator matrix is $G_N$, and the intermediate decoding vector is obtained by multiplying the to-be-diagnosed vector mod 2 by $G_N$. One or more elements located at the location are selected from the intermediate decoding vector based on the locations of the frozen bits in code subblocks corresponding to the LLR vector having the length of M, to form the symptom vector. Alternatively, the to-be-diagnosed vector is multiplied by a word block check matrix H to obtain the symptom vector.

Step 506: Select L candidate vectors from the at least Y candidate vectors obtained by using the Y to-be-diagnosed vectors.

PM values corresponding to the at least Y candidate vectors are calculated, and L optimal candidate vectors are selected.

It should be noted that, in this embodiment of this application, if a path width of an SCL is L, although a quantity of candidate vectors selected at the level with the LLR vector having the length of M is also represented by L, the quantity of candidate vectors may be the same as or different from the path width.

Step 507: Determine decoding results of the LLR vector based on the L candidate vectors.

Specifically, if N=M, an operation is performed on each of the L candidate vectors and the generator matrix to obtain L candidate results, and a decision is performed on the L candidate results to obtain decoding results of the to-be-decoded information.

If N>M, an operation is performed on each of the L candidate vectors and the generator matrix to obtain L candidate results, and a decision is performed on the L candidate results to obtain a part of the decoding results of the to-be-decoded information, or in other words, to obtain a decoding result of a code subblock. The decoding results of the to-be-decoded information are output after decoding of all code subblocks is completed.

The following further describes step 503 to step 505 by using an example.

It is assumed that M=8. In this case, an inputted LLR vector {LLR 0 to LLR 7}={1, −3, −2, 2, −1, 3, −4, 1}, and an original vector={0, 1, 1, 0, 1, 0, 1, 0} is obtained through a hard decision. Locations A of the first X LLRs sorted in ascending order of absolute values of LLRs in the LLR vector are equal to $\{a_0, a_1 \ldots a_{x-1}\}$. It is assumed that X=3. In this case, locations of the first three LLRs sorted in ascending order of absolute values in the LLR vector are the zeroth location, the fourth location, and the seventh location, that is, $\{a_0, a_1, a_2\}=\{0, 4, 7\}$. $A_{ny}$ quantity of elements are selected from A to form a flipping set $E_i$, where $E_i \subseteq A$. A quantity of flipping sets $E_i$ is $2^X$. When X=3, there are eight flipping sets in total, which are specifically $E_0=\emptyset$, $E_1=\{a_0\}$, $E_2=\{a_1\}$, $E_3=\{a_0, a_1\}$, $E_4=\{a_2\}$, $E_5=\{a_0, a_2\}$, $E_6=\{a_1, a_2\}$, and $E_7=\{a_0, a_1, a_2\}$. Negation is performed on at least 0 of X elements in the original vector by using the flipping set $E_i$, to obtain a to-be-diagnosed vector. The X elements in the original vector are elements at the zeroth, the fourth, and the seventh locations. For example, if $E_i$ is an empty set, negation is performed on zero elements in the original vector, that is, an obtained to-be-diagnosed vector is equal to the original vector {0, 1, 1, 0, 1, 0, 1, 0}. If $E_1=\{a_0\}$, negation is performed on an element at the zeroth location of the original vector to obtain a to-be-diagnosed vector {1, 1, 1, 0, 1, 0, 1, 0}. If $E_2=\{a_1\}$, negation is performed on an element at the fourth location of the original vector to obtain a to-be-diagnosed vector $\{0, 1, 1, 0, 0, 0, 1, 0\}$. If $E_3=\{a_0, a_1\}$, negation is performed on elements at the zeroth and the fourth locations of the original vector to obtain a to-be-diagnosed vector $\{1, 1, 1, 0, 0, 0, 1, 0\}$. If $E_4=\{a_2\}$, negation is performed on an element at the seventh location of the original vector to obtain a to-be-diagnosed vector $\{0, 1, 1, 0, 1, 0, 1, 1\}$. If $E_5=\{a_0, a_2\}$, negation is performed on elements at the zeroth and the fourth locations of the original vector to obtain a to-be-diagnosed vector $\{1, 1, 1, 0, 0, 0, 1, 0\}$. If $E_6=\{a_1, a_2\}$, negation is performed on elements at the fourth and the seventh locations of the original vector to obtain a to-be-diagnosed vector $\{0, 1, 1, 0, 0, 0, 1, 1\}$. If $E_7=\{a_0, a_1, a_2\}$, negation is performed on elements at the zeroth, the fourth, and the seventh locations of the original vector to obtain a to-be-diagnosed vector $\{1, 1, 1, 0, 0, 0, 1, 1\}$. In conclusion, when the inputted LLR vector $\{LLR\ 0\ to\ LLR\ 7\}=\{1, -3, -2, 2, -1, 3, -4, 1\}$, and X=3, eight to-be-diagnosed vectors obtained by using the original vector are respectively $\{0, 1, 1, 0, 1, 0, 1, 0\}$, $\{1, 1, 1, 0, 1, 0, 1, 0\}$, $\{0, 1, 1, 0, 0, 0, 1, 0\}$, $\{1, 1, 1, 0, 0, 0, 1, 0\}$, $\{0, 1, 1, 0, 1, 0, 1, 1\}$, $\{1, 1, 1, 0, 0, 0, 1, 0\}$, $\{0, 1, 1, 0, 0, 0, 1, 1\}$, and $\{1, 1, 1, 0, 0, 0, 1, 1\}$. When X=3, a quantity of the Y to-be-diagnosed vectors obtained in step 504 may be less than or equal to eight, that is, a part of the eight to-be-diagnosed vectors are selected to go to step 505. In step 505, the intermediate decoding vector is determined based on the any to-be-diagnosed vector. For example, the to-be-diagnosed vector is $\{1, 1, 1, 0, 0, 0, 1, 0\}$, and an intermediate decoding vector $\{0, 1, 0, 0, 1, 0, 1, 0\}$ is obtained by multiplying the to-be-diagnosed vector $\{1, 1, 1, 0, 0, 0, 1, 0\}$ mod 2 by the matrix $G_N$. If locations of information bits and frozen bits in the to-be-decoded code block or the to-be-decoded code subblocks corresponding to the M LLRs are set to $\{0, 0, 0, 1, 0, 1, 1, 1\}$, elements at locations of the frozen bits are selected from the intermediate decoding vector $\{0, 1, 0, 0, 1, 0, 1, 0\}$. To be specific, elements at the zeroth, the first, the second, and the fourth locations are selected to obtain a symptom vector $\{0, 1, 0, 1\}$. Similarly, a symptom vector may be obtained for each to-be-diagnosed vector in the foregoing manner.

The following describes the symptom diagnosis table in the foregoing descriptions in the embodiments of this application.

The symptom diagnosis table may also be referred to as a check table. The symptom diagnosis table stores a correspondence between a symptom vector and a diagnosis vector. One symptom vector may correspond to one or more diagnosis vectors. The length of the symptom vector is a quantity of frozen bits in a to-be-decoded code subblock, and the length of the diagnosis vector is M. A size of an existing symptom diagnosis table is related to the quantity of frozen bits or a quantity of information bits in the to-be-decoded code subblock. It is assumed that the quantity of information bits is K, and a size of the code subblock is M. In this case, the size of the symptom diagnosis table is equal to $2^{(M-K)}$. A decoder or a decoding apparatus (device) stores different symptom diagnosis tables based on different K. In step 505, a corresponding symptom diagnosis table is selected based on the quantity of frozen bits in the to-be-decoded code subblock. Usually, one symptom diagnosis table includes one or more rows, and is stored in order of decimal values of symptom vectors, for example, in ascending order of decimal values of the symptom vectors. Each time one symptom vector is obtained, a corresponding row is selected from the selected symptom diagnosis table, and a diagnosis vector corresponding to the symptom vector is determined in the corresponding row. Specifically, Z diagnosis vectors may be selected by using the symptom vector, where $Z \geq 1$. A value of Z may be adjusted. A larger value of Z indicates higher decoding precision and higher computational complexity. A smaller value of Z indicates lower decoding precision and lower computational complexity. The value of Z may be determined based on a balance between decoding precision and computational complexity.

In the embodiments of this application, to save storage space occupied by the symptom diagnosis table, a part of the correspondence between a symptom vector and a diagnosis vector is stored in the symptom diagnosis table, and the other part is computed online by using the stored part. It is assumed that row numbers in the symptom diagnosis table start from 0. Optionally, a diagnosis vector in a $2i^{th}$ row in the symptom diagnosis table is prestored, a diagnosis vector in a $(2i+1)^{th}$ row in the symptom diagnosis table is obtained through online computing, a manner of the online computing is performing negation on the last element in the stored diagnosis vector in the $2i^{th}$ row, and i is a nonnegative integer. That is, i=0, 1, 2, . . . . To be specific, the symptom diagnosis table designed in the embodiments of this application stores only a diagnosis vector of an even row in a conventional symptom diagnosis table. A diagnosis vector of an odd row in the conventional symptom diagnosis table is obtained through online computing, and is specifically obtained by performing negation on the last element in the diagnosis vector of the even row. For example, M=16, K=7, and the size of the symptom diagnosis table is 512. The conventional symptom diagnosis table is referred to as an original table, and the symptom diagnosis table provided in the embodiments of this application is referred to as a new table. In this case, only the last bit is different between the odd row and the even row in the original table. A relationship is represented as follows: Table[2i+1]=Table[2i]^0x0001, where Table[2i+1] is used to indicate the odd row, and Table[2i] is used to indicate the even row. The new table Table_new[i] is represented by using the original table as follows: Value[2i]=Table_new[i], and Value[2i+1]=Table_new[i]^0x0001. An $i^{th}$ piece of flipping information in an $x^{th}$ row in the new table may be represented as follows: Value[x][i]=Value[x][0]^Value[0][j]. A size of the new table is half of that of the original table. In other words, half of the storage space is saved relative to the original table. Further, a row of the symptom diagnosis table is represented by i, and a column is represented by j. The symptom diagnosis table may be further reduced to three groups of values, and store only all information in the first row, all information in the first column, and a correspondence between each i in each row and j in the zeroth row. In this way, the storage space can be further saved. Certainly, alternatively, only an odd row may be stored, and a diagnosis vector of an even row is obtained through online computing. Specifically, the diagnosis vector of the even row is obtained by performing negation on the last element in the diagnosis vector of the odd row. Principles are consistent, and details are not described again.

In the embodiments of this application, for a to-be-decoded code block or a to-be-decoded code subblock having a size of M, a corresponding symptom diagnosis table is determined based on the length K of information bits. In other words, different values of K correspond to different symptom diagnosis tables. First, a symptom diagnosis table corresponding to a value of K is selected based on the value of K, then a diagnosis vector is determined based on the symptom diagnosis table, and finally a candidate vector is obtained. However, based on construction of a polar code, there may be one or more information bit sequences for the given code length M and the given length K of information bits. In the embodiments of this application, one value of K corresponds to one symptom diagnosis table, that is, one information bit sequence corresponds to one symptom diagnosis table. If an information bit sequence corresponding to a to-be-decoded code block or a to-be-decoded code subblock does not correspond to an information bit sequence corresponding to a symptom diagnosis table, interleaving needs to be first performed based on a same code weight on the information bit sequence corresponding to the to-be-decoded code block or the to-be-decoded code subblock, so that an interleaved information bit sequence is the same as the information bit sequence corresponding to the symptom diagnosis table. Correspondingly, the same interleaving processing needs to be performed on an LLR vector, and de-interleaving processing is performed on intermediate decoding results in a same manner. In this way, decoding results can be finally obtained for the inputted LLR vector by using the steps shown in FIG. 5. Specifically, before step 503, the interleaving processing is performed on the inputted LLR vector. In step 507, the de-interleaving processing is first performed on the L candidate vectors, and then the decoding results of the LLR vector are determined based on the candidate vectors obtained after the de-interleaving processing.

Figure 6:
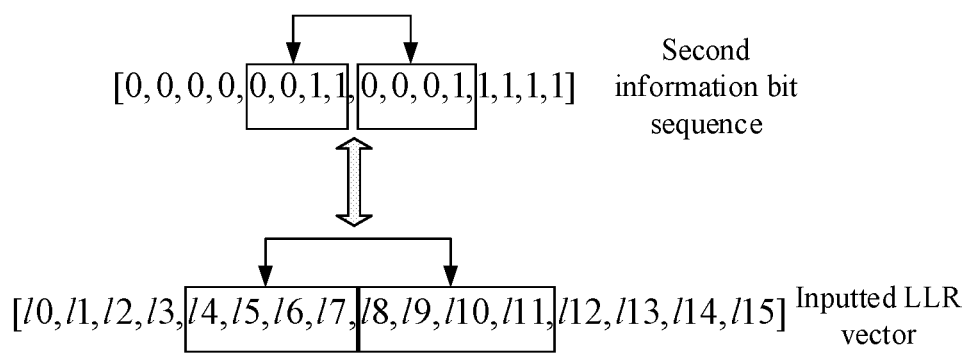
FIG. 6 is a schematic diagram of interleaving processing according to an embodiment of this application.

For example, it is assumed that M=16 and K=7. In this case, an inputted LLR vector is represented as follows: [$LLR_0$, $LLR_1$, ..., $LLR_{15}$][l0, l1, l2, l3, l4, l5, l6, l7, l8, l9, l10, l11, l12, l13, l14, l15]. A second bit sequence corresponding to the symptom diagnosis table is as follows: [$i_0$, $i_1$, $i_2$ ... $i_{15}$]=[0, 0, 0, 0, 0, 0, 1, 1, 0, 0, 0, 1, 1, 1, 1, 1], and the information bit sequence is used to indicate locations of information bits and locations of frozen bits. A first bit sequence corresponding to the to-be-decoded code block or the to-be-decoded code subblock is as follows: [$i_0$, $i_1$, $i_2$ ... $i_{15}$]=[0, 0, 0, 0, 0, 0, 0, 1, 0, 0, 1, 1, 1, 1, 1, 1]. It can be learned that the two information bit sequences are different, that is, the locations of the information bits and the locations of the frozen bits are different. Interleaving processing shown in FIG. 6 can be performed on the first bit sequence to obtain the second bit sequence. To be specific, $i_4$ to $i_7$ may be exchanged with $i_8$ to $i_{11}$ in the first bit sequence to obtain the second bit sequence. Correspondingly, the interleaving processing shown in FIG. 6 needs to be performed on the inputted LLR vector. To be specific, an $LLR_4$ to an $LLR_7$ are exchanged with an $LLR_8$ to an $LLR_{11}$ in the inputted LLR vector. An LLR vector obtained after the interleaving processing is [l0, l1, l2, l3, l8, l9, l10, l11, l4, l5, l6, l7, l12, l13, l14, l15]. After candidate vectors of the LLR vector having the length of M are obtained, intermediate decoding results of to-be-decoded information having the length of M are further obtained, or a part of the intermediate decoding results corresponding to a code subblock having the length of M are obtained, and de-interleaving processing is performed on the intermediate decoding results or the part of the intermediate decoding results in the foregoing interleaving processing manner. For example, the intermediate decoding results or the part of the intermediate decoding results are [$b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$], and elements at the fourth to the seventh locations are exchanged with elements at the eighth to the eleventh locations in the sequence to obtain final decoding results or a final part of the decoding results: [$b_0$, $b_1$, $b_2$, $b_3$, $b_8$, $b_9$, $b_{10}$, $b_{11}$, $b_4$, $b_5$, $b_6$, $b_7$, $b_{12}$, $b_{13}$, $b_{14}$, $b_{15}$].

It should be noted that, in the method shown in FIG. 5, in a process of selecting the L candidate vectors from the Y candidate vectors, a possibility that there are duplicate vectors in the Y candidate vectors needs to be considered. Therefore, in this application, deduplication processing is first performed on the Y candidate vectors, and the L candidate vectors are selected from candidate vectors obtained after the deduplication processing. The deduplication processing means that only one of duplicate candidate vectors is reserved, and any two of the candidate vectors obtained after the deduplication processing are different.

The following describes a deduplication processing method.

Negation is performed on X elements of an original vector to obtain deduplicated vectors, locations of the X elements in the original vector are consistent with locations of the first X LLRs sorted in ascending order of absolute values in an LLR vector, and a definition of X is consistent with the foregoing description. An "AND" operation is performed on a diagnosis vector and a deduplicated vector. If there are elements including 1 in an obtained result vector, the corresponding diagnosis vector is marked as an unusable vector, or a PM value of a candidate vector obtained by using the corresponding diagnosis vector is set to infinity. In this way, these vectors are filtered out when a better path is selected based on PM values.

For example, in the foregoing example, X=3, and locations of the first three LLRs sorted in ascending order of absolute values in the LLR vector are the zeroth location, the fourth location, and the seventh location. M=8, negation is performed on elements at the zeroth location, the fourth location, and the seventh location of the original vector to obtain {1, 0, 0, 0, 1, 0, 0, 1}, which is referred to as a deduplicated vector. An "AND" operation is performed on an obtained diagnosis vector and the deduplicated vector. If there are elements including 1 in an obtained result vector, the corresponding diagnosis vector is marked as an unusable vector, or a PM value of a candidate vector obtained by using the corresponding diagnosis vector is set to infinity. For example, the obtained diagnosis vector is {0, 0, 0, 0, 1, 1, 0, 0}, and a result obtained after the "AND" operation is performed on the obtained diagnosis vector and the deduplicated vector is {0, 0, 0, 0, 1, 0, 0, 0}. Therefore, the diagnosis vector {0, 0, 0, 0, 1, 1, 0, 0} is unavailable, the diagnosis vector {0, 0, 0, 0, 1, 1, 0, 0} is marked as an unusable vector, or a PM value of a candidate vector obtained by using the diagnosis vector {0, 0, 0, 0, 1, 1, 0, 0} is set to infinity.

In addition, if a shortening encoding scheme is used on an encoding side, there may be a shortening bit in each of decoding results of to-be-decoded information or a to-be-decoded code subblock. In this case, each of the L candidate vectors obtained in step 506 is compared with a location of the shortening bit, and an unmatched candidate vector is deleted, or a PM value of the unmatched candidate vector is marked as infinity. The unmatch means that an element at the location of the shortening bit in a candidate vector is not 0.

In conclusion, for to-be-decoded information or a to-be-decoded code subblock having the length of M, a quantity of information bits corresponding to the to-be-decoded information or the to-be-decoded code subblock is K, and the decoding method shown in FIG. 5 is applicable to 0<the quantity K of information bits≤M. For example, when M=16, the decoding method shown in FIG. 5 is applicable to 0<K≤16. According to the decoding method shown in FIG. 5, a parallel decision for to-be-decoded information or a to-be-decoded code subblock that includes any quantity of information bits helps reduce computational complexity. Especially, when M is greater than 4, by using the decoding method shown in FIG. 5, the computational complexity can be greatly reduced relative to an exhaustive expansion manner of an existing maximum likelihood (ML) estimation decoding method. For a path width L=8, to be specific, when SCL-8 decoding is used, the decoding method shown in FIG. 5 can shorten decoding duration by 40% relative to the exhaustive expansion manner of the conventional ML decoding method.

Figure 7:
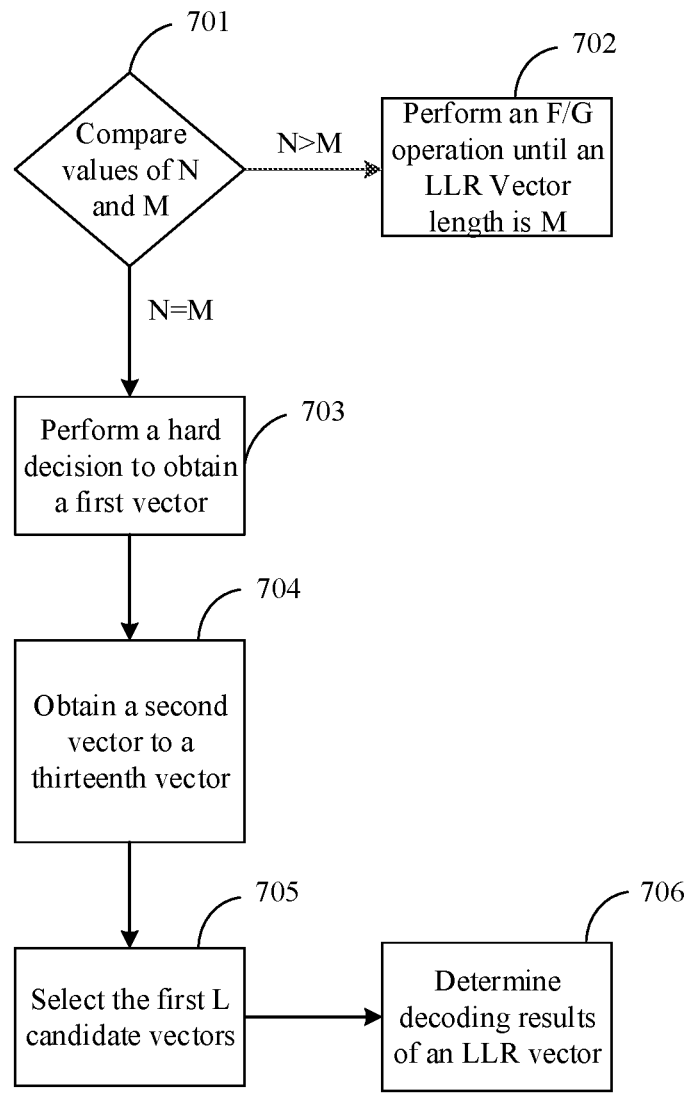
FIG. 7 is a second schematic diagram of a decoding method according to an embodiment of this application.

Based on the decoding method shown in FIG. 5, in the embodiments of this application, for K=M, a decoding method shown in FIG. 7 may be used.

As shown in FIG. 7, the decoding method for K=M provided in an embodiment of this application is specifically described as follows. The decoding method is performed by a decoding device. The decoding device may be a network device 301 shown in FIG. 3, or may be a terminal 302 shown in FIG. 3.

Step 701: Determine a value relationship between the length N of to-be-decoded information and M. If the length N of the to-be-decoded information is greater than M, step 702 is performed; or if the length N of the to-be-decoded information is equal to M, step 703 is performed.

Step 702: Perform, level by level, at least one level of F/G operation on N LLRs corresponding to the to-be-decoded information until the length of an LLR vector at a level after the F/G operation is equal to M, and perform step 703.

Step 703: Perform a hard decision on each LLR in the inputted LLR vector to obtain an original vector. For ease of description, the original vector may also be referred to as a first vector.

Step 704: Sequentially perform at least the first (L−1) of the following operations:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on the first element and the second element in the first vector to obtain a ninth vector;

performing negation on the first element and the third element in the first vector to obtain a tenth vector;

performing negation on the first element and the fourth element in the first vector to obtain an eleventh vector;

performing negation on the second element and the third element in the first vector to obtain a twelfth vector; and performing negation on the first element, the second element, and the third element in the first vector to obtain a thirteenth vector.

Locations of the first element to an $X^{th}$ element in the first vector correspond to locations of the first X LLRs sorted in ascending order of absolute values in the LLR vector. If X=7, the first seventh LLRs sorted in ascending order of absolute values in the LLR vector are assumed to be represented by [LLR 0, LLR 1, LLR 2, ..., LLR 6]. In this case, locations of the first element to the seventh element in the first vector are in a one-to-one correspondence with locations of the [LLR 0, LLR 1, LLR 2, ..., LLR 6] in the LLR vector. In other words, a location of the first element in the first vector is consistent with a location of the LLR 0 in the LLR vector, and a location of the second element in the first vector is consistent with a location of the LLR 1 in the LLR vector. Similarly, locations of other elements are determined.

Step 705: Sequentially select the first L vectors from obtained vectors, where the selection starts from the first vector.

Step 706: Determine decoding results of the LLR vector based on the L vectors.

Specifically, if L=8, the first L vectors are the first vector, the second vector, ..., and the eighth vector. If L=4, the first L vectors are the first vector, the second vector, ..., and the fourth vector.

Figure 8:
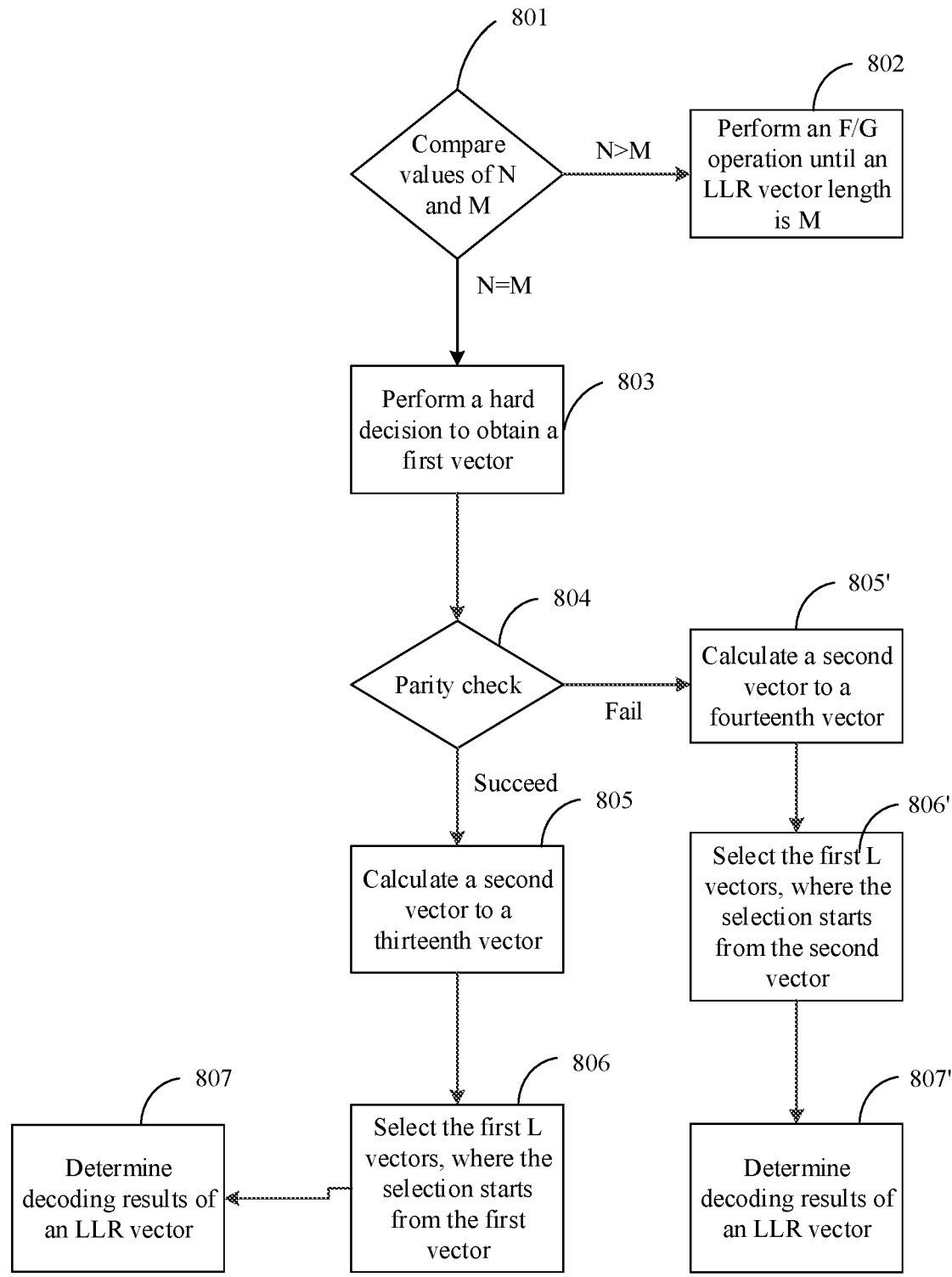
FIG. 8 is a third schematic diagram of a decoding method according to an embodiment of this application.

Based on the decoding method shown in FIG. 5, in the embodiments of this application, for K=M−1, a decoding method shown in FIG. 8 may be used.

As shown in FIG. 8, the decoding method for K=M−1 provided in an embodiment of this application is specifically described as follows. The decoding method is performed by a decoding device. The decoding device may be a network device 301 shown in FIG. 3, or may be a terminal 302 shown in FIG. 3.

Step 801: Determine a value relationship between the length N of to-be-decoded information and M. If the length N of the to-be-decoded information is greater than M, step 802 is performed; or if the length N of the to-be-decoded information is equal to M, step 803 is performed.

Step 802: Perform, level by level, at least one level of F/G operation on N LLRs corresponding to the to-be-decoded information until the length of an LLR vector at a level after the F/G operation is equal to M, and perform step 803.

Step 803: Perform a hard decision on each LLR in the inputted LLR vector to obtain an original vector. For ease of description, the original vector may also be referred to as a first vector.

Step 804: Perform parity check on the first vector. If the check succeeds, step 805 to step 807 are performed; or if the check fails, step 805' to step 807' are performed.

Step 805: Sequentially perform at least the first (L−1) of the following operations:

performing negation on a first element and a second element in the first vector to obtain a second vector;

performing negation on the first element and a third element in the first vector to obtain a third vector;

performing negation on the first element and a fourth element in the first vector to obtain a fourth vector;

performing negation on the first element and a fifth element in the first vector to obtain a fifth vector;

performing negation on the first element and a sixth element in the first vector to obtain a sixth vector;

performing negation on the first element and a seventh element in the first vector to obtain a seventh vector;

performing negation on the first element and an eighth element in the first vector to obtain an eighth vector;

performing negation on the second element and the third element in the first vector to obtain a ninth vector;

performing negation on the second element and the fourth element in the first vector to obtain a tenth vector;

performing negation on the second element and the fifth element in the first vector to obtain an eleventh vector;

performing negation on the third element and the fourth element in the first vector to obtain a twelfth vector; and performing negation on the first element to the fourth element in the first vector to obtain a thirteenth vector.

Locations of the first element to an $X^{th}$ element in the first vector correspond to locations of the first X LLRs sorted in ascending order of absolute values in the LLR vector. If X=8, the first eight LLRs sorted in ascending order of absolute values in the LLR vector are assumed to be represented by [LLR 0, LLR 1, LLR 2, ..., LLR 7]. In this case, locations of the first element to the eighth element in the first vector are in a one-to-one correspondence with locations of the [LLR 0, LLR 1, LLR 2, ..., LLR 7] in the LLR vector. In other words, a location of the first element in the first vector is consistent with a location of the LLR 0 in the LLR vector, and a location of the second element in the first vector is consistent with a location of the LLR 1 in the LLR vector. Similarly, locations of other elements are determined.

Step 806: Sequentially select the first L vectors from vectors obtained in step 805, where the selection starts from the first vector.

Step 807: Determine decoding results of the LLR vector based on the L vectors.

Step 805': Sequentially perform at least the first L of the following operations:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on an eighth element in the first vector to obtain a ninth vector;

performing negation on the first element, the second element, and the third element in the first vector to obtain a tenth vector;

performing negation on the first element, the second element, and the fourth element in the first vector to obtain an eleventh vector;

performing negation on the first element, the third element, and the fourth element in the first vector to obtain a twelfth vector;

performing negation on the second element, the third element, and the fourth element in the first vector to obtain a thirteenth vector; and performing negation on the first element, the second element, and the fifth element in the first vector to obtain a fourteenth vector.

Locations of the first element to an $X^{th}$ element in the first vector correspond to locations of the first X LLRs sorted in ascending order of absolute values in the LLR vector. If X=8, the first eight LLRs sorted in ascending order of absolute values in the LLR vector are assumed to be represented by [LLR 0, LLR 1, LLR 2, ..., LLR 7]. In this case, locations of the first element to the eighth element in the first vector are in a one-to-one correspondence with locations of the [LLR 0, LLR 1, LLR 2, ..., LLR 7] in the LLR vector. In other words, a location of the first element in the first vector is consistent with a location of the LLR 0 in the LLR vector, and a location of the second element in the first vector is consistent with a location of the LLR 1 in the LLR vector. Similarly, locations of other elements are determined.

Step 806': Sequentially select the first L vectors from vectors obtained in step 805', where the selection starts from the second vector.

Step 807': Determine decoding results of the LLR vector based on the L vectors.

In this embodiment of this application, optionally, when a value of K is relatively small, an exhaustive expansion manner of an existing ML decoding method may be selected to obtain a candidate vector.

In conclusion, decoding may be performed by using the method in FIG. 5, FIG. 7, or FIG. 8, or in the exhaustive expansion manner of the existing ML decoding method based on a size of the value of K. The method in FIG. 7 is applicable to a case in which M=K, the method in FIG. 8 is applicable to a case in which M=K+1, the method in FIG. 5 is applicable to a case in which 0<K<M, and the exhaustive expansion manner of the existing ML decoding method is applicable to a case in which the value of K is not greater than a threshold, for example, the threshold may be set to 6.

For example, when M=16, if K≤6, the exhaustive expansion manner of the existing ML decoding method is selected for decoding. If 6<K<14, the method shown in FIG. 5 is selected for decoding. If K=14, the method shown in FIG. 7 is selected for decoding. If K=15, the method shown in FIG. 8 is selected for decoding.

The following uses a specific example to describe an exhaustive expansion manner of an existing ML decoding method, and further describe the method shown in FIG. 5 in the embodiments of this application.

Figure 9:
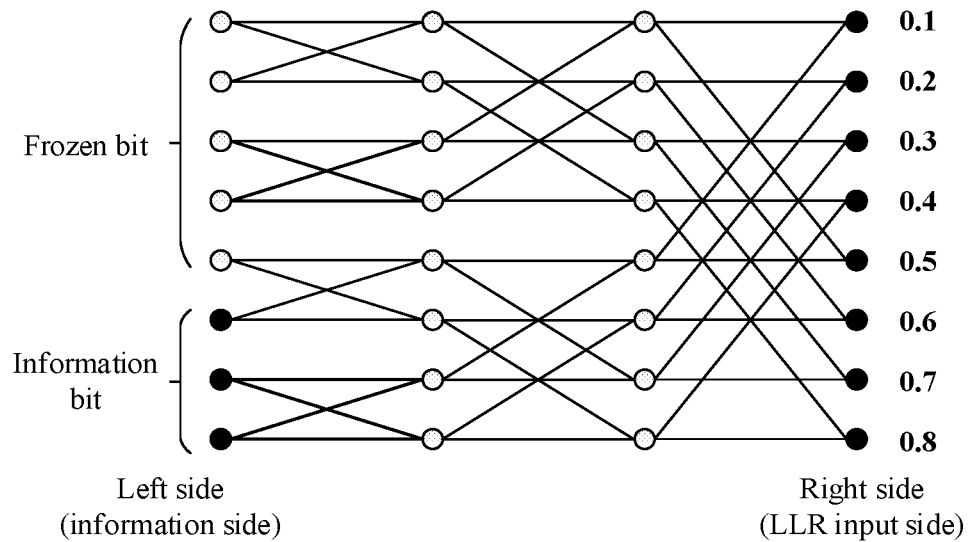
FIG. 9 is a schematic diagram of a decoding process in an application scenario according to an embodiment of this application.

As shown in FIG. 9, if M=8 and K=3, decoding may be performed in an exhaustive expansion manner of an existing ML decoding method. The right side is an LLR input side, or referred to as a code word side. The left side is an information side, or referred to as a decoded bit side. An inputted LLR vector is [0.1, 0.2, 0.3, 0.4, 0.5, 0.6, 0.7, 0.8]. Path splitting is directly performed at an LLR input level. Because locations of information bits on the information side are the fifth, sixth, and seventh locations, if it is assumed that the information bits are represented by $u_5$, $u_6$, and $u_7$, there may be eight cases for the information bits $[u_5, u_6, u_7]$: [0, 0, 0], [0, 0, 1], [0, 1, 0], [0, 1, 1], ..., and [1, 1, 1] respectively. Correspondingly, there may also be eight cases for encoded code words $[c_0, c_1, c_2, ..., \text{and } c_7]$, to be specific, eight possible candidate vectors are obtained through splitting at the LLR input level: [0, 0, 0, 0, 0, 0, 0, 0], [1, 1, 1, 1, 1, 1, 1, 1], [1, 0, 1, 0, 1, 0, 1, 0,], [0, 1, 0, 1, 0, 1, 0, 1], ..., and [1, 0, 0, 1, 1, 0, 0, 1] respectively. PM values are calculated for the eight candidate vectors to obtain the PM values 0, 3.6, 1.6, 2.0, ..., and 1.8. Then, L candidate vectors are selected from the eight candidate vectors based on sizes of the PM values. A calculation formula of a PM value (represented by ΔPM) at a level of an LLR vector having the length of 8 is $$\Delta PM = \sum_{i=0}^{7}(|L_i||c_i - (1 - \text{sgn}(L_i))/2|),$$

where $c_i$ is used to represent an $i^{th}$ element of a candidate vector, $L_i$ is used to represent an $i^{th}$ element of the LLR vector, and $c_i-(1-\text{sgn}(L_i))/2$ is used to calculate whether the $i^{th}$ element of the LLR vector matches the $i^{th}$ element of the candidate vector.

Figure 10:
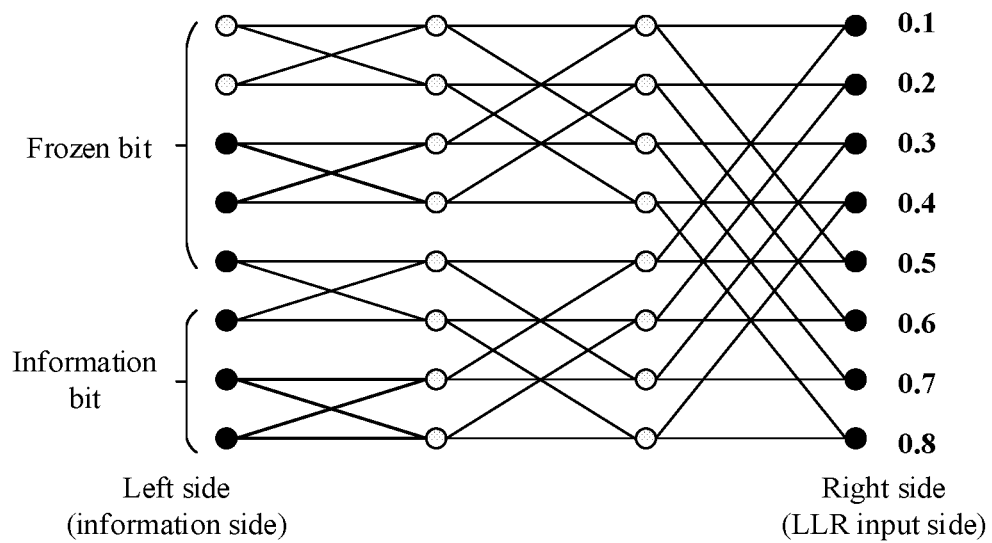
FIG. 10 is a schematic diagram of a decoding process in another application scenario according to an embodiment of this application.

As shown in FIG. 10, if M=8 and K=6, decoding may be performed by using the method shown in FIG. 5. The right side is an LLR input side, or referred to as a code word side. The left side is an information side, or referred to as a decoded bit side. An Inputted LLR vector $[L_0, L_1, \ldots, L_7]$ is [0.1, 0.2, 0.3, 0.4, 0.5, 0.6, 0.7, 0.8]. Path splitting is directly performed at an LLR input level, but the splitting needs to be performed according to the method shown in FIG. 5. Specifically, an original vector obtained after a hard decision is performed on the LLR vector is [0, 0, 0, 0, 0, 0, 0, 0]. It is assumed that X=2, and the first two LLRs sorted in ascending order of absolute values in the LLR vector are $L_0$ and $L_1$, namely, the zeroth location and the first location. In this case, negation is performed on an element at at least 0 of the zeroth location and the first location in the original vector [0, 0, 0, 0, 0, 0, 0, 0], and a maximum of four to-be-diagnosed vectors may be obtained: [00000000], [10000000], [01000000], and [11000000] respectively. Intermediate decoding vectors of the to-be-diagnosed vectors are determined based on a generator matrix, and symptom vectors are selected from the intermediate decoding vectors based on locations of frozen bits. It can be learned from FIG. 10 that the locations of the frozen bits are the zeroth location and the first location, and the selected symptom vectors are respectively [00], [11], [01], and [10]. Diagnosis vectors are selected from a symptom diagnosis table based on the symptom vectors. Table 1 shows some rows of the symptom diagnosis table. A part of the rows in Table 1 may be prestored, and the other part of the rows may be computed online.

TABLE 1

| Symptom vector | Diagnosis vector | | | |
| --- | --- | --- | --- | --- |
| 00 | 00000000 | 10100000 | 10001000 | 10000010 |
| 10 | 10000000 | 00100000 | 00001000 | 00000010 |
| 01 | 11000000 | 10010000 | 10000100 | 10000001 |
| 11 | 01000000 | 00010000 | 00000100 | 00000001 |

An exclusive OR operation is performed on each diagnosis vector and each of the to-be-diagnosed vectors to obtain 16 candidate vectors. Details are as follows:

$[00000000]_1 \otimes \{[00000000], [10100000], [10001000], [10000010]\} = \{[00000000], [10100000], [10001000], [10000010]\}$;

$[10000000]_1 \otimes \{[10000000], [00100000], [00001000], [00000010]\} = \{[00000000], [10100000], [10001000], [10000010]\}$;

$[01000000]_1 \otimes \{[11000000], [10010000], [10000100], [10000001]\} = \{[10000000], [11010000], [11000100], [11000001]\}$; and $[11000000]_1 \otimes \{[01000000], [00010000], [00000100], [00000001]\} = \{[10000000], [11010000], [11000100], [11000001]\}$.

Candidate vectors that are duplicate in the 16 candidate vectors are deleted, and the candidate vectors that are duplicate are candidate vectors shown in bold in the foregoing. Candidate vectors obtained after deduplication processing are {[00000000], [10100000], [10001000], [10000010], [11010000], [11000100], [11000001]}.

Alternatively, PM values of the candidate vectors that are duplicate are marked as infinity during subsequent PM value calculation. PM values of the foregoing 16 candidate vectors={0, ∞, ∞, ∞}, {∞, 0.4, 0.6, 0.8}, {∞, ∞, ∞, ∞}, {∞, 0.7, 0.9, 1.1}.

L candidate vectors are selected based on the PM values from the candidate vectors obtained after the deduplication processing, and L decoding results of the LLR vector are determined based on the L candidate vectors and the generator matrix. The decoding results include frozen bits and information bits.

Figure 11:
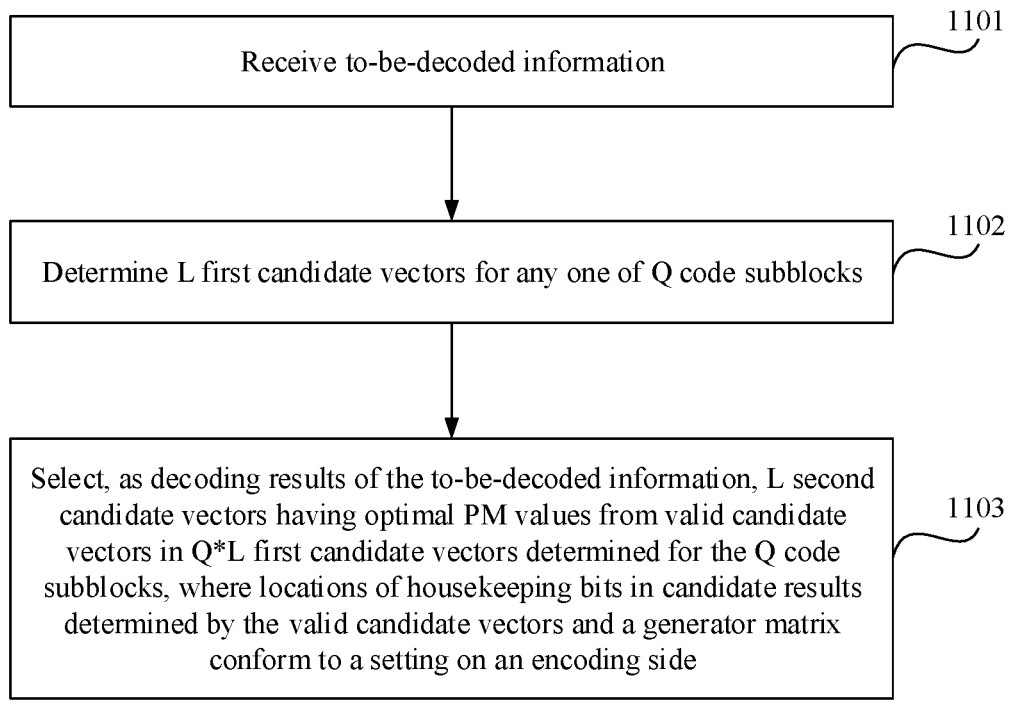
FIG. 11 is a fourth schematic diagram of a decoding method according to an embodiment of this application.

Based on the decoding methods shown in FIG. 5, FIG. 7, and FIG. 8, in the embodiments of this application, to reduce a CRC false alarm, a decoding method shown in FIG. 11 may be used.

As shown in FIG. 11, another decoding method provided in an embodiment of this application is specifically described as follows. The decoding method is performed by a decoding device. The decoding device may be a network device 301 shown in FIG. 3, or may be a terminal 302 shown in FIG. 3.

Step 1101: Receive to-be-decoded information, where the length of the to-be-decoded information is N, the to-be-decoded information includes Q code subblocks, the length of one code subblock is M, M≤N, and M is 2 raised to the power of a positive integer.

Step 1102: Determine L first candidate vectors for any one of the Q code subblocks.

Step 1103: Select, as decoding results of the to-be-decoded information, L second candidate vectors having optimal PM values from valid candidate vectors in Q*L first candidate vectors determined for the Q code subblocks, where locations of housekeeping bits in candidate results determined by the valid candidate vectors and a generator matrix conform to a setting on an encoding side.

A method for determining the L first candidate vectors based on the any code subblock in step 1102 may be performed according to the method for determining the L candidate vectors in the method shown in FIG. 5, or may be performed according to the method for determining the L vectors in the method shown in FIG. 7 or FIG. 8. Repeated content is not described herein again.

Figure 12:
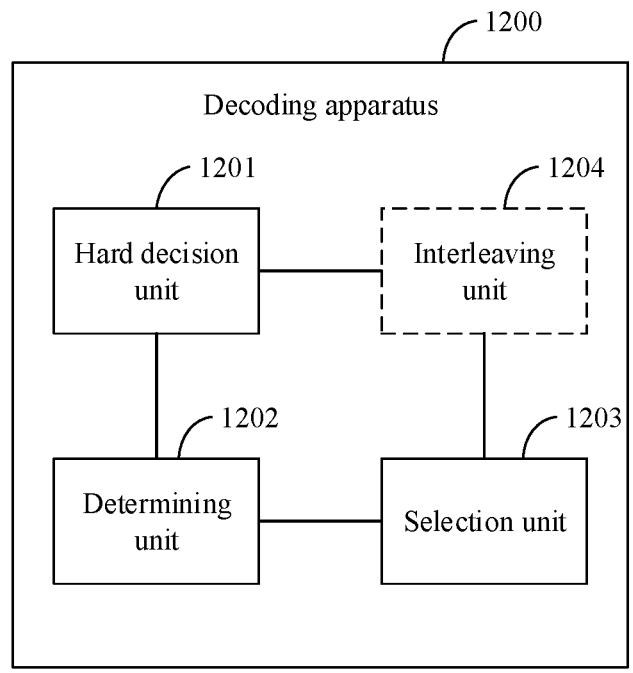
FIG. 12 is a first schematic structural diagram of a decoding apparatus according to an embodiment of this application.

Based on the decoding method shown in FIG. 5, as shown in FIG. 12, an embodiment of this application further provides a decoding apparatus 1200. The decoding apparatus 1200 is configured to perform the decoding method shown in FIG. 5. The decoding apparatus 1200 includes:

a hard decision unit 1201, configured to perform a hard decision on each LLR in an inputted log likelihood ratio LLR vector to obtain an original vector, where the length of the LLR vector is M, M≤N, N is the length of to-be-decoded information, and N and M are 2 raised to the power of a positive integer;

a determining unit 1202, configured to: determine Y to-be-diagnosed vectors based on the original vector obtained by the hard decision unit 1201, where the to-be-diagnosed vector is obtained by performing negation on at least 0 of X elements in the original vector, locations of the X elements in the original vector are consistent with locations of the first X LLRs sorted in ascending order of absolute values in the LLR vector, and $Y \leq 2^X$; and determine at least one candidate vector based on each of the Y to-be-diagnosed vectors, where a manner of determining the at least one candidate vector based on any to-be-diagnosed vector is: determining an intermediate decoding vector of the to-be-diagnosed vector based on a generator matrix; selecting a symptom vector from the intermediate decoding vector based on locations of frozen bits; selecting at least one diagnosis vector from a symptom diagnosis table based on the symptom vector; and performing an exclusive OR operation on each diagnosis vector and the to-be-diagnosed vector to obtain the at least one candidate vector, where the symptom diagnosis table includes a correspondence between a symptom vector and a diagnosis vector; and a selection unit 1203, configured to select L candidate vectors from at least Y candidate vectors obtained by using the Y to-be-diagnosed vectors that are determined by the determining unit 1202.

The determining unit 1202 is further configured to determine decoding results of the LLR vector based on the L candidate vectors selected by the selection unit 1203.

Optionally, the decoding apparatus 1200 further includes an interleaving unit 1204, configured to:

if a first bit sequence corresponding to the LLR vector is different from a specified second bit sequence, perform interleaving processing on the inputted LLR vector, and perform a hard decision on each LLR in an LLR vector obtained after the interleaving processing, to obtain the original vector, where the same interleaving processing is performed on the first bit sequence to obtain the second bit sequence, and the locations of the frozen bits are determined based on the second bit sequence.

The interleaving unit 1204 is further configured to: perform de-interleaving processing on each of the L candidate vectors, and determine the decoding results of the LLR vector based on L candidate vectors obtained after the de-interleaving processing.

Optionally, the selection unit 1203 is configured to: if there is a duplicate candidate vector in the at least Y candidate vectors obtained by using the Y to-be-diagnosed vectors, perform deduplication processing on the at least Y candidate vectors, and select the L candidate vectors from candidate vectors obtained after the deduplication processing, where any two of the candidate vectors obtained after the deduplication processing are different.

Figure 13:
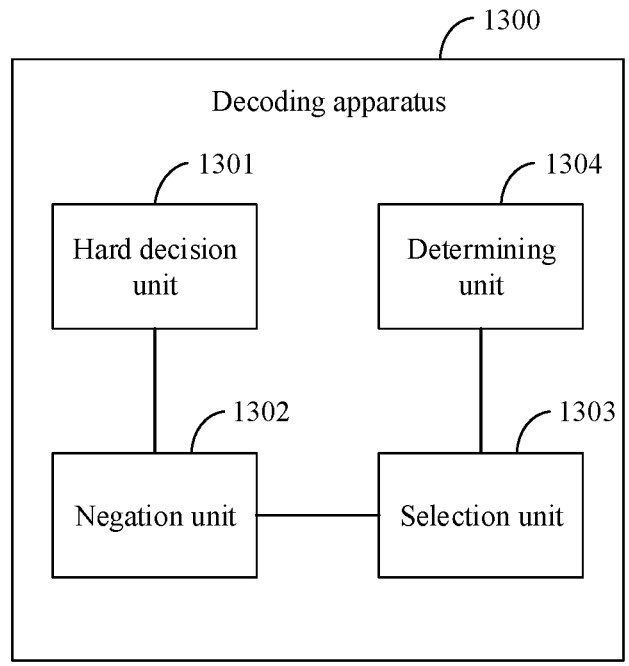
FIG. 13 is a second schematic structural diagram of a decoding apparatus according to an embodiment of this application.

Based on the decoding method shown in FIG. 7, as shown in FIG. 13, an embodiment of this application further provides a decoding apparatus 1300. The decoding apparatus 1300 is configured to perform the decoding method shown in FIG. 7. The decoding apparatus 1300 includes:

a hard decision unit 1301, configured to perform a hard decision on each LLR in an inputted log likelihood ratio LLR vector to obtain a first vector, where the length of the LLR vector is M, K=M≤N, N is the length of to-be-decoded information, N and M are 2 raised to the power of a positive integer, and K is the length of information bits;

a negation unit 1302, configured to sequentially perform at least the first (L−1) of the following operations:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on the first element and the second element in the first vector to obtain a ninth vector;

performing negation on the first element and the third element in the first vector to obtain a tenth vector;

performing negation on the first element and the fourth element in the first vector to obtain an eleventh vector;

performing negation on the second element and the third element in the first vector to obtain a twelfth vector; and performing negation on the first element, the second element, and the third element in the first vector to obtain a thirteenth vector, where locations of the first element to an $X^{th}$ element in the first vector correspond to locations of the first X LLRs sorted in ascending order of absolute values in the LLR vector;

a selection unit 1303, configured to sequentially select the first L vectors from obtained vectors, where the selection starts from the first vector; and a determining unit 1304, configured to determine decoding results of the LLR vector based on the L vectors.

Figure 14:
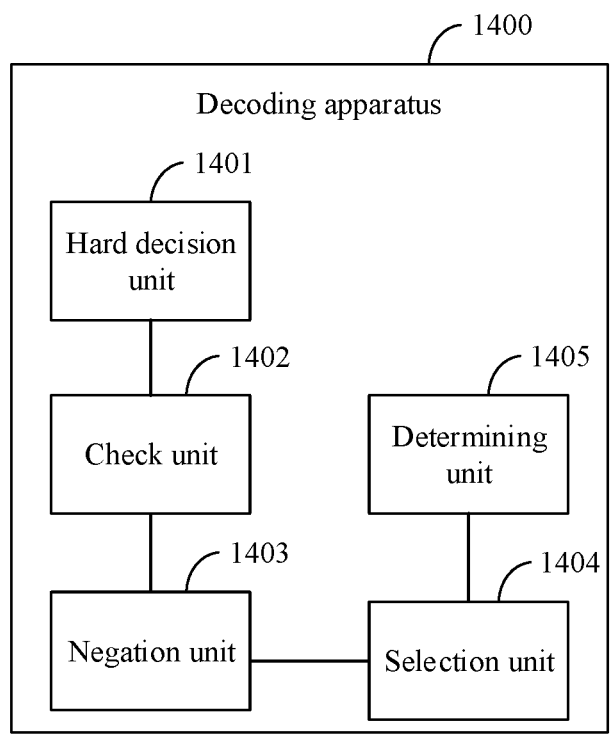
FIG. 14 is a third schematic structural diagram of a decoding apparatus according to an embodiment of this application.

Based on the decoding method shown in FIG. 8, as shown in FIG. 14, an embodiment of this application further provides a decoding apparatus 1400. The decoding apparatus 1400 is configured to perform the decoding method shown in FIG. 8. The decoding apparatus 1400 includes:

a hard decision unit 1401, configured to perform a hard decision on each LLR in an inputted log likelihood ratio LLR vector to obtain a first vector, where the length of the LLR vector is M, (K+1)=M≤N, N is the length of to-be-decoded information, N and M are 2 raised to the power of a positive integer, and K is the length of an information bit;

a check unit 1402, configured to perform parity check on the first vector obtained by the hard decision unit 1401;

a negation unit 1403, configured to: if the check performed by the check unit 1402 succeeds, sequentially perform at least the first (L−1) of the following operations:

performing negation on a first element and a second element in the first vector to obtain a second vector;

performing negation on the first element and a third element in the first vector to obtain a third vector;

performing negation on the first element and a fourth element in the first vector to obtain a fourth vector;

performing negation on the first element and a fifth element in the first vector to obtain a fifth vector;

performing negation on the first element and a sixth element in the first vector to obtain a sixth vector;

performing negation on the first element and a seventh element in the first vector to obtain a seventh vector;

performing negation on the first element and an eighth element in the first vector to obtain an eighth vector;

performing negation on the second element and the third element in the first vector to obtain a ninth vector;

performing negation on the second element and the fourth element in the first vector to obtain a tenth vector;

performing negation on the second element and the fifth element in the first vector to obtain an eleventh vector;

performing negation on the third element and the fourth element in the first vector to obtain a twelfth vector; and performing negation on the first element to the fourth element in the first vector to obtain a thirteenth vector, where locations of the first element to an $X^{th}$ element in the first vector correspond to locations of the first X LLRs sorted in ascending order of absolute values in the LLR vector;

a selection unit 1404, configured to sequentially select the first L vectors from obtained vectors, where the selection starts from the first vector; and a determining unit 1405, configured to determine decoding results of the LLR vector based on the L vectors.

Optionally, the negation unit 1403 is further configured to: if the check performed by the check unit 1402 fails, sequentially perform at least the first L of the following operations:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on an eighth element in the first vector to obtain a ninth vector;

performing negation on the first element, the second element, and the third element in the first vector to obtain a tenth vector;

performing negation on the first element, the second element, and the fourth element in the first vector to obtain an eleventh vector;

performing negation on the first element, the third element, and the fourth element in the first vector to obtain a twelfth vector;

performing negation on the second element, the third element, and the fourth element in the first vector to obtain a thirteenth vector; and performing negation on the first element, the second element, and the fifth element in the first vector to obtain a fourteenth vector, where locations of the first element to an $X^{th}$ element in the first vector correspond to locations of the first X LLRs sorted in ascending order of absolute values in the LLR vector;

the selection unit 1404 is further configured to sequentially select the first L vectors from obtained vectors, where the selection starts from the second vector; and the determining unit 1405 is further configured to determine decoding results of the LLR vector based on the L vectors.

Figure 15:
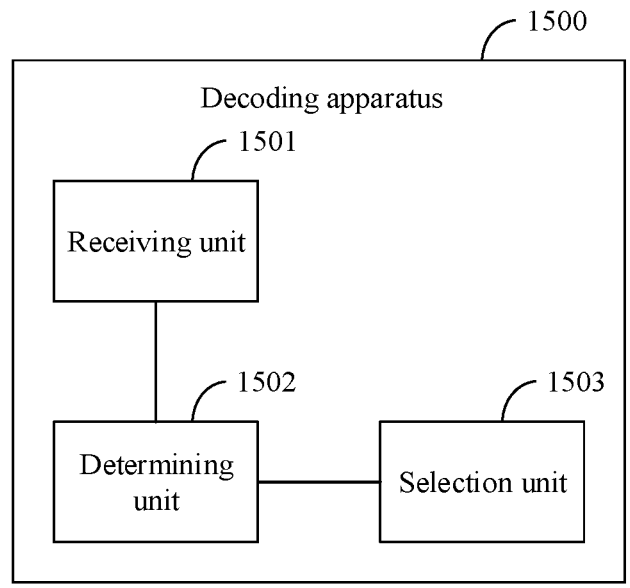
FIG. 15 is a fourth schematic structural diagram of a decoding apparatus according to an embodiment of this application.

Based on the decoding method shown in FIG. 11, as shown in FIG. 15, an embodiment of this application further provides a decoding apparatus 1500. The decoding apparatus 1500 is configured to perform the decoding method shown in FIG. 11. The decoding apparatus 1500 includes:

a receiving unit 1501, configured to receive to-be-decoded information, where the length of the to-be-decoded information is N, the to-be-decoded information includes Q code subblocks, the length of one code subblock is M, M≤N, and M is 2 raised to the power of a positive integer;

a determining unit 1502, configured to determine L first candidate vectors for any one of the Q code subblocks; and a selection unit 1503, configured to select, as decoding results of the to-be-decoded information, L second candidate vectors having optimal PM values from valid candidate vectors in Q*L first candidate vectors determined for the Q code subblocks, where locations of housekeeping bits in candidate results determined by the valid candidate vectors and a generator matrix conform to a setting on an encoding side.

Optionally, the determining unit 1502 is configured to:

when the L first candidate vectors are determined based on the any code subblock, perform the method for determining the L candidate vectors in the method shown in FIG. 5, or perform the method for determining the L vectors in the method shown in FIG. 7 or FIG. 8.

It should be noted that in the embodiments of this application, module division of the decoding apparatus shown in FIG. 12 to FIG. 15 is an example and is merely logical function division, and may be other division in actual implementation. In addition, function units in the embodiments of this application may be integrated into one processing unit, or may exist alone physically, or two or more units may be integrated into one unit. The foregoing integrated unit may be implemented in a form of hardware, or may be implemented in a form of a software function unit.

Figure 16:
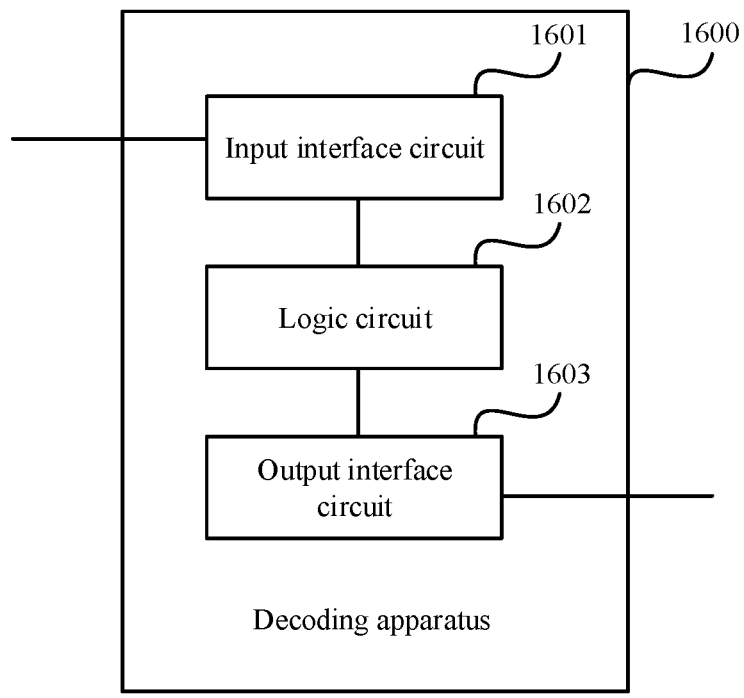
FIG. 16 is a fifth schematic structural diagram of a decoding apparatus according to an embodiment of this application.

Based on a similar concept as the decoding method shown in FIG. 5, as shown in FIG. 16, an embodiment of this application further provides a decoding apparatus 1600. The decoding apparatus 1600 is configured to perform the decoding method shown in FIG. 5. A part or all of the decoding method shown in FIG. 5 may be implemented by hardware, or may be implemented by software. When a part or all of the decoding method is implemented by hardware, the decoding apparatus 1600 includes: an input interface circuit 1601, configured to obtain to-be-decoded information; a logic circuit 1602, configured to perform the decoding method shown in FIG. 5; and an output interface circuit 1603, configured to output decoding results.

Optionally, in specific implementation, the decoding apparatus 1600 may be a chip or an integrated circuit.

Figure 17:
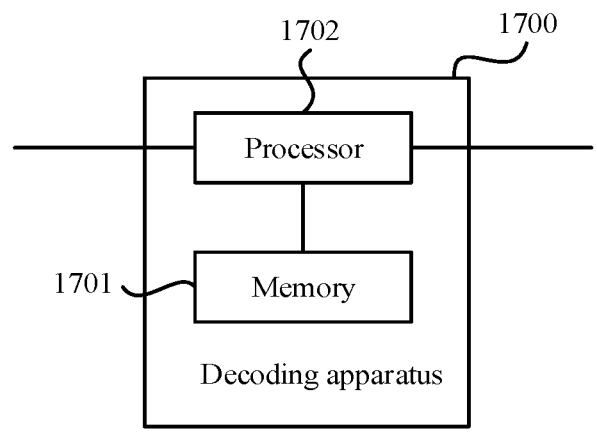
FIG. 17 is a sixth schematic structural diagram of a decoding apparatus according to an embodiment of this application.

Optionally, when a part or all of the decoding method shown in FIG. 5 is implemented by software, as shown in FIG. 17, a decoding apparatus 1700 includes: a memory 1701, configured to store a program; and a processor 1702, configured to execute the program stored in the memory 1701. When the program is executed, the decoding apparatus 1700 is enabled to implement the decoding method shown in FIG. 5.

Optionally, the memory 1701 may be a physically independent unit, or may be integrated with the processor 1702.

Optionally, when a part or all of the decoding method shown in FIG. 5 is implemented by software, the decoding apparatus 1700 may alternatively include only the processor 1702. The memory 1701 configured to store the program is located outside the decoding apparatus 1700. The processor 1702 is connected to the memory 1701 by using a circuit/wire, and is configured to read and execute the program stored in the memory 1701.

The processor 1702 may be a central processing unit (CPU), a network processor (NP), or a combination of a CPU and an NP.

The processor 1702 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1701 may include a volatile memory, for example, a random access memory (RAM). The memory 1701 may also include a nonvolatile memory, for example, a flash memory, a hard disk drive (HDD), or a solid-state drive (SSD). The memory 1701 may further include a combination of the foregoing types of memories.

Figure 18:
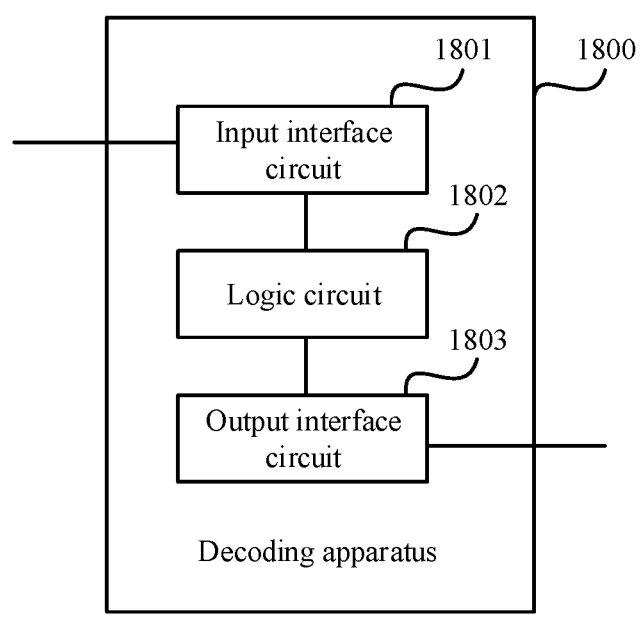
FIG. 18 is a seventh schematic structural diagram of a decoding apparatus according to an embodiment of this application.

Based on a similar concept as the decoding method shown in FIG. 7, as shown in FIG. 18, an embodiment of this application further provides a decoding apparatus 1800. The decoding apparatus 1800 is configured to perform the decoding method shown in FIG. 7. A part or all of the decoding method shown in FIG. 7 may be implemented by hardware, or may be implemented by software. When a part or all of the decoding method is implemented by hardware, the decoding apparatus 1800 includes: an input interface circuit 1801, configured to obtain to-be-decoded information; a logic circuit 1802, configured to perform the decoding method shown in FIG. 7; and an output interface circuit 1803, configured to output decoding results.

Optionally, in specific implementation, the decoding apparatus 1800 may be a chip or an integrated circuit.

Figure 19:
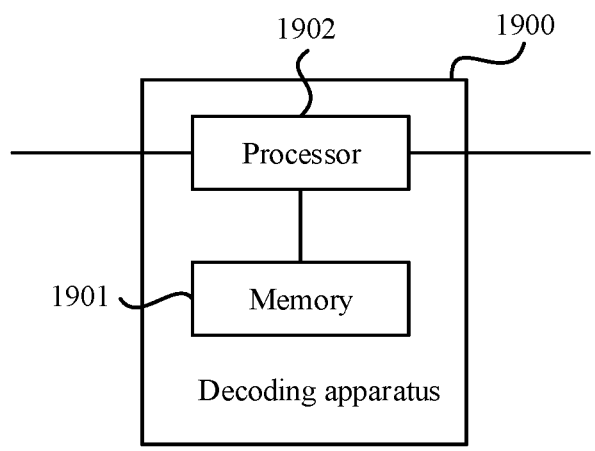
FIG. 19 is an eighth schematic structural diagram of a decoding apparatus according to an embodiment of this application.

Optionally, when a part or all of the decoding method shown in FIG. 7 is implemented by software, as shown in FIG. 19, a decoding apparatus 1900 includes: a memory 1901, configured to store a program; and a processor 1902, configured to execute the program stored in the memory 1901. When the program is executed, the decoding apparatus 1900 is enabled to implement the decoding method shown in FIG. 7.

Optionally, the memory 1901 may be a physically independent unit, or may be integrated with the processor 1902.

Optionally, when a part or all of the decoding method shown in FIG. 7 is implemented by software, the decoding apparatus 1900 may alternatively include only the processor 1902. The memory 1901 configured to store the program is located outside the decoding apparatus 1900. The processor 1902 is connected to the memory 1901 by using a circuit/wire, and is configured to read and execute the program stored in the memory 1901.

The processor 1902 may be a central processing unit (CPU), a network processor (NP), or a combination of a CPU and an NP.

The processor 1902 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1901 may include a volatile memory, for example, a random access memory (RAM). The memory 1901 may also include a nonvolatile memory, for example, a flash memory, a hard disk drive (HDD), or a solid-state drive (SSD). The memory 1901 may further include a combination of the foregoing types of memories.

Figure 20:
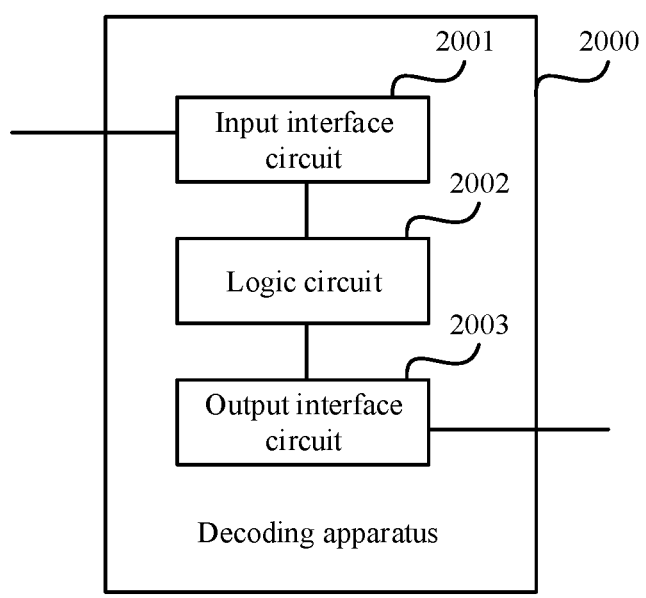
FIG. 20 is a ninth schematic structural diagram of a decoding apparatus according to an embodiment of this application.

Based on a similar as the decoding method shown in FIG. 8, as shown in FIG. 20, an embodiment of this application further provides a decoding apparatus 2000. The decoding apparatus 2000 is configured to perform the decoding method shown in FIG. 8. A part or all of the decoding method shown in FIG. 8 may be implemented by hardware, or may be implemented by software. When a part or all of the decoding method is implemented by hardware, the decoding apparatus 2000 includes: an input interface circuit 2001, configured to obtain to-be-decoded information; a logic circuit 2002, configured to perform the decoding method shown in FIG. 8; and an output interface circuit 2003, configured to output decoding results.

Optionally, in specific implementation, the decoding apparatus 2000 may be a chip or an integrated circuit.

Figure 21:
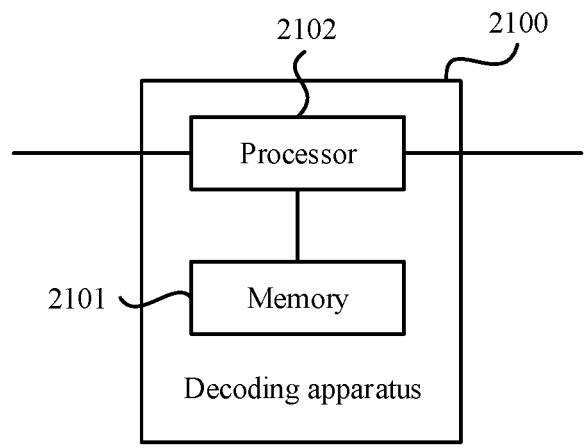
FIG. 21 is a tenth schematic structural diagram of a decoding apparatus according to an embodiment of this application.

Optionally, when a part or all of the decoding method shown in FIG. 8 is implemented by software, as shown in FIG. 21, a decoding apparatus 2100 includes: a memory 2101, configured to store a program; and a processor 2102, configured to execute the program stored in the memory 2101. When the program is executed, the decoding apparatus 2100 is enabled to implement the decoding method shown in FIG. 8.

Optionally, the memory 2101 may be a physically independent unit, or may be integrated with the processor 2102.

Optionally, when a part or all of the decoding method shown in FIG. 8 is implemented by software, the decoding apparatus 2100 may alternatively include only the processor 2102. The memory 2101 configured to store the program is located outside the decoding apparatus 2100. The processor 2102 is connected to the memory 2101 by using a circuit/wire, and is configured to read and execute the program stored in the memory 2101.

The processor 2102 may be a central processing unit (CPU), a network processor (NP), or a combination of a CPU and an NP.

The processor 2102 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 2101 may include a volatile memory, for example, a random access memory (RAM). The memory 2101 may also include a nonvolatile memory, for example, a flash memory, a hard disk drive (HDD), or a solid-state drive (SSD). The memory 2101 may further include a combination of the foregoing types of memories.

Figure 22:
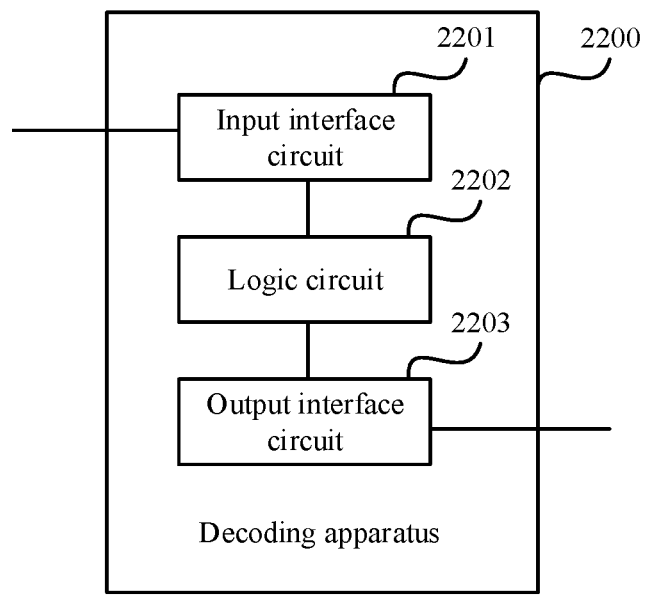
FIG. 22 is an eleventh schematic structural diagram of a decoding apparatus according to an embodiment of this application.

Based on a similar concept as the decoding method shown in FIG. 11, as shown in FIG. 22, an embodiment of this application further provides a decoding apparatus 2200. The decoding apparatus 2200 is configured to perform the decoding method shown in FIG. 11. A part or all of the decoding method shown in FIG. 11 may be implemented by hardware, or may be implemented by software. When a part or all of the decoding method is implemented by hardware, the decoding apparatus 2200 includes: an input interface circuit 2201, configured to obtain to-be-decoded information; a logic circuit 2202, configured to perform the decoding method shown in FIG. 11; and an output interface circuit 2203, configured to output decoding results.

Optionally, in specific implementation, the decoding apparatus 2200 may be a chip or an integrated circuit.

Figure 23:
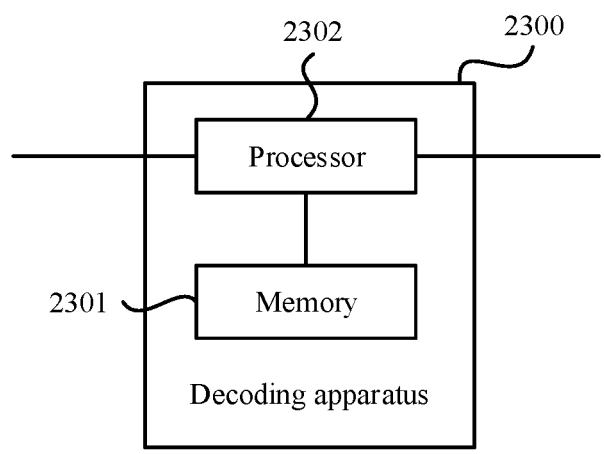
FIG. 23 is a twelfth schematic structural diagram of a decoding apparatus according to an embodiment of this application.

Optionally, when a part or all of the decoding method shown in FIG. 11 is implemented by software, as shown in FIG. 23, a decoding apparatus 2300 includes: a memory 2301, configured to store a program; and a processor 2302, configured to execute the program stored in the memory 2301. When the program is executed, the decoding apparatus 2300 is enabled to implement the decoding method shown in FIG. 11.

Optionally, the memory 2301 may be a physically independent unit, or may be integrated with the processor 2302.

Optionally, when a part or all of the decoding method shown in FIG. 11 is implemented by software, the decoding apparatus 2300 may alternatively include only the processor 2302. The memory 2301 configured to store the program is located outside the decoding apparatus 2300. The processor 2302 is connected to the memory 2301 by using a circuit/wire, and is configured to read and execute the program stored in the memory 2301.

The processor 2302 may be a central processing unit (CPU), a network processor (NP), or a combination of a CPU and an NP.

The processor 2302 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 2301 may include a volatile memory, for example, a random access memory (RAM). The memory 2301 may also include a nonvolatile memory, for example, a flash memory, a hard disk drive (HDD), or a solid-state drive (SSD). The memory 2301 may further include a combination of the foregoing types of memories.

An embodiment of this application provides a computer storage medium storing a computer program, and the computer program includes an instruction used to perform the decoding methods provided in the foregoing method embodiments.

An embodiment of this application provides a computer program product including an instruction. When the computer program product runs on a computer, the computer is enabled to perform the decoding methods provided in the foregoing method embodiments.

Any decoding apparatus provided in the embodiments of this application may alternatively be a chip.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a magnetic disk memory, a CD-ROM, an optical memory, and the like) that include computer-usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of another programmable data processing device to generate a machine, so that the instructions executed by a computer or the processor of another programmable data processing device generate an apparatus for implementing a specific function in one or more processes in the flowcharts and/or in one or more blocks in the block diagrams.

These computer program instructions may alternatively be stored in a computer-readable memory that can instruct the computer or the another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may alternatively be loaded onto the computer or the another programmable data processing device, so that a series of operation steps are performed on the computer or the another programmable device, to generate computer-implemented processing. Therefore, the instructions executed on the computer or the another programmable device provide steps for implementing a specific function in one or more processes in the flowcharts and/or in one or more blocks in the block diagrams.

Although embodiments of this application have been described, persons skilled in the art can make additional changes and modifications to these embodiments once they learn the basic inventive concept. Therefore, the following claims are intended to be construed to cover the embodiments and all changes and modifications falling within the scope of this application.

Clearly, persons skilled in the art can make various modifications and variations to the embodiments of this application without departing from the scope of the embodiments of this application. This application is intended to cover these modifications and variations provided that they fall within the scope the following claims and their equivalent technologies.

What is claimed is:

1. A decoding method, comprising:
   obtaining, by a decoding device, to-be-decoded information;
   obtaining, by the decoding device, an inputted log likelihood ratio (LLR) vector based on the to-be-decoded information;
   performing, by the decoding device, a hard decision on each LLR in the inputted LLR vector to obtain a first vector, wherein a length of the LLR vector is M, K=M<N, N is a length of to-be-decoded information, N and M are 2 raised to the power of a positive integer, and K is a length of information bits;
   sequentially performing, by the decoding device, at least the following L-1 times of operations, wherein, L is a number of candidate vectors:
   performing negation on a first element in the first vector to obtain a second vector;
   performing negation on a second element in the first vector to obtain a third vector;
   performing negation on a third element in the first vector to obtain a fourth vector;
   performing negation on a fourth element in the first vector to obtain a fifth vector;
   performing negation on a fifth element in the first vector to obtain a sixth vector;
   performing negation on a sixth element in the first vector to obtain a seventh vector;
   performing negation on a seventh element in the first vector to obtain an eighth vector;
   performing negation on the first element and the second element in the first vector to obtain a ninth vector;
   performing negation on the first element and the third element in the first vector to obtain a tenth vector;
   performing negation on the first element and the fourth element in the first vector to obtain an eleventh vector;
   performing negation on the second element and the third element in the first vector to obtain a twelfth vector; and
   performing negation on the first element, the second element, and the third element in the first vector to obtain a thirteenth vector, wherein
   locations of the first element to an $X^{th}$ element in the first vector correspond to locations of the first X LLRs sorted in ascending order of absolute values in the LLR vector; and
   sequentially selecting, by the decoding device, the first L vectors from sorted vectors, wherein the selection starts from the first vector, and determining decoding results of the LLR vector based on the L vectors.

2. A decoding method, comprising:
   obtaining, by a decoding device, to-be-decoded information;
   obtaining, by the decoding device, an inputted log likelihood ratio (LLR) vector based on the to-be-decoded information;

performing, by the decoding device, a hard decision on each LLR in the inputted log likelihood ratio LLR vector to obtain a first vector, wherein a length of the LLR vector is M, (K+1)=M<N, N is a length of to-be-decoded information, N and M are 2 raised to the power of a positive integer, and K is a length of an information bit;

performing, by the decoding device, parity check on the first vector, and if the check succeeds, sequentially performing at least the following L-1 times of operations, wherein, L is a number of candidate vectors:

performing negation on a first element and a second element in the first vector to obtain a second vector;

performing negation on the first element and a third element in the first vector to obtain a third vector;

performing negation on the first element and a fourth element in the first vector to obtain a fourth vector;

performing negation on the first element and a fifth element in the first vector to obtain a fifth vector;

performing negation on the first element and a sixth element in the first vector to obtain a sixth vector;

performing negation on the first element and a seventh element in the first vector to obtain a seventh vector;

performing negation on the first element and an eighth element in the first vector to obtain an eighth vector;

performing negation on the second element and the third element in the first vector to obtain a ninth vector;

performing negation on the second element and the fourth element in the first vector to obtain a tenth vector;

performing negation on the second element and the fifth element in the first vector to obtain an eleventh vector;

performing negation on the third element and the fourth element in the first vector to obtain a twelfth vector; and performing negation on the first element to the fourth element in the first vector to obtain a thirteenth vector, wherein locations of the first element to an $X^{th}$ element in the first vector correspond to locations of the first X LLRs sorted in ascending order of absolute values in the LLR vector; and sequentially selecting, by the decoding device, the first L vectors from sorted vectors, wherein the selection starts from the first vector, and determining decoding results of the LLR vector based on the L vectors.

3. The method according to claim 2, wherein if the parity check fails, sequentially performing, by the decoding device, at least the following L times of operations:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on an eighth element in the first vector to obtain a ninth vector;

performing negation on the first element, the second element, and the third element in the first vector to obtain a tenth vector;

performing negation on the first element, the second element, and the fourth element in the first vector to obtain an eleventh vector;

performing negation on the first element, the third element, and the fourth element in the first vector to obtain a twelfth vector;

performing negation on the second element, the third element, and the fourth element in the first vector to obtain a thirteenth vector; and performing negation on the first element, the second element, and the fifth element in the first vector to obtain a fourteenth vector, wherein locations of the first element to an $X^{th}$ element in the first vector correspond to locations of the first X LLRs sorted in ascending order of absolute values in the LLR vector; and sequentially selecting, by the decoding device, the first L vectors from sorted vectors, wherein the selection starts from the second vector, and determining decoding results of the LLR vector based on the L vectors.

4. A decoding apparatus, comprising:

a nontransitory memory, configured to store a program; and a processor, configured to execute the program stored in the memory, wherein when the program is executed, the processor is configured to:

obtain to-be-decoded information;

obtain an inputted log likelihood ratio (LLR) vector based on the to-be-decoded information;

perform a hard decision on each LLR in the inputted LLR vector to obtain a first vector, wherein a length of the LLR vector is M, K=M<N, N is a length of to-be-decoded information, N and M are 2 raised to the power of a positive integer, and K is a length of information bits;

sequentially perform at least the following L-1 times of operations, wherein, L is a number of candidate vectors:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on the first element and the second element in the first vector to obtain a ninth vector;

performing negation on the first element and the third element in the first vector to obtain a tenth vector;

performing negation on the first element and the fourth element in the first vector to obtain an eleventh vector;

performing negation on the second element and the third element in the first vector to obtain a twelfth vector; and performing negation on the first element, the second element, and the third element in the first vector to obtain a thirteenth vector, wherein locations of the first element to an $X^{th}$ element in the first vector correspond to locations of the first X LLRs sorted in ascending order of absolute values in the LLR vector;

sequentially select the first L vectors from sorted vectors, wherein the selection starts from the first vector; and determine decoding results of the LLR vector based on the L vectors.

5. A decoding apparatus, comprising:

a nontransitory memory, configured to store a program; and a processor, configured to execute the program stored in the memory, wherein when the program is executed, the processor is configured to:

obtain to-be-decoded information;

obtain an inputted log likelihood ratio (LLR) vector based on the to-be-decoded information;

perform a hard decision on each LLR in the inputted LLR vector to obtain a first vector, wherein a length of the LLR vector is M, (K+1)=M<N, N is a length of to-be-decoded information, N and M are 2 raised to the power of a positive integer, and K is a length of an information bit;

perform parity check on the first vector;

if the check succeeds, sequentially perform at least the following L-1 times of operations, wherein, L is a number of candidate vectors:

performing negation on a first element and a second element in the first vector to obtain a second vector;

performing negation on the first element and a third element in the first vector to obtain a third vector;

performing negation on the first element and a fourth element in the first vector to obtain a fourth vector;

performing negation on the first element and a fifth element in the first vector to obtain a fifth vector;

performing negation on the first element and a sixth element in the first vector to obtain a sixth vector;

performing negation on the first element and a seventh element in the first vector to obtain a seventh vector;

performing negation on the first element and an eighth element in the first vector to obtain an eighth vector;

performing negation on the second element and the third element in the first vector to obtain a ninth vector;

performing negation on the second element and the fourth element in the first vector to obtain a tenth vector;

performing negation on the second element and the fifth element in the first vector to obtain an eleventh vector;

performing negation on the third element and the fourth element in the first vector to obtain a twelfth vector; and performing negation on the first element to the fourth element in the first vector to obtain a thirteenth vector, wherein locations of the first element to an $X^{th}$ element in the first vector correspond to locations of the first X LLRs sorted in ascending order of absolute values in the LLR vector;

sequentially select the first L vectors from sorted vectors, wherein the selection starts from the first vector; and determine decoding results of the LLR vector based on the L vectors.

6. The apparatus according to claim 5, wherein the processor is further configured to:

if the check fails, sequentially perform at least the following L times of operations:

performing negation on a first element in the first vector to obtain a second vector;

performing negation on a second element in the first vector to obtain a third vector;

performing negation on a third element in the first vector to obtain a fourth vector;

performing negation on a fourth element in the first vector to obtain a fifth vector;

performing negation on a fifth element in the first vector to obtain a sixth vector;

performing negation on a sixth element in the first vector to obtain a seventh vector;

performing negation on a seventh element in the first vector to obtain an eighth vector;

performing negation on an eighth element in the first vector to obtain a ninth vector;

performing negation on the first element, the second element, and the third element in the first vector to obtain a tenth vector;

performing negation on the first element, the second element, and the fourth element in the first vector to obtain an eleventh vector;

performing negation on the first element, the third element, and the fourth element in the first vector to obtain a twelfth vector;

performing negation on the second element, the third element, and the fourth element in the first vector to obtain a thirteenth vector; and performing negation on the first element, the second element, and the fifth element in the first vector to obtain a fourteenth vector, wherein locations of the first element to an $X^{th}$ element in the first vector correspond to locations of the first X LLRs sorted in ascending order of absolute values in the LLR vector;

sequentially select the first L vectors from sorted vectors, wherein the selection starts from the second vector; and determine decoding results of the LLR vector based on the L vectors.

7. A non-transitory computer storage medium, configured to store a computer program, the computer program comprises instructions used to perform the method according to claim 1.

8. A computer storage medium, configured to store a computer program, the computer program comprises instructions used to perform the method according to claim 2.

* * * * *